(12) United States Patent
Hoshuyama

(10) Patent No.: US 8,223,829 B2
(45) Date of Patent: Jul. 17, 2012

(54) ADAPTIVE DIGITAL FILTER, SIGNAL PROCESSING METHOD, FM RECEIVER, AND PROGRAM

(75) Inventor: Osamu Hoshuyama, Tokyo (JP)

(73) Assignee: NEC Corporation, Tokyo (JP)

( * ) Notice: Subject to any disclaimer, the term of this patent is extended or adjusted under 35 U.S.C. 154(b) by 1193 days.

(21) Appl. No.: 11/988,550

(22) PCT Filed: Jul. 14, 2006

(86) PCT No.: PCT/JP2006/314051
§ 371 (c)(1),
(2), (4) Date: Jan. 10, 2008

(87) PCT Pub. No.: WO2007/010849
PCT Pub. Date: Jan. 25, 2007

(65) Prior Publication Data
US 2009/0122931 A1    May 14, 2009

(30) Foreign Application Priority Data
Jul. 15, 2005    (JP) ................. 2005-206721

(51) Int. Cl.
*H03H 7/30* (2006.01)
*H03H 7/40* (2006.01)
*H03K 5/159* (2006.01)

(52) U.S. Cl. ........ 375/232; 375/350; 375/347; 375/324; 375/233; 375/346

(58) Field of Classification Search .......... 375/350, 375/347, 324, 232, 233, 346; 475/350, 347, 475/324, 232, 233, 346
See application file for complete search history.

(56) References Cited

U.S. PATENT DOCUMENTS
4,797,950 A * 1/1989 Rilling ................. 455/276.1
(Continued)

FOREIGN PATENT DOCUMENTS
JP     08-056245    2/1996
(Continued)

OTHER PUBLICATIONS

J.R. Treichler et al., "A New Approach to Multipath Correction of Constant Modulus Signals," IEEE Transactions on Acoustics, Speech and Signal Processing, vol. ASSP-31, No. 2, Apr. 1983, pp. 459-472.

(Continued)

*Primary Examiner* — Shuwang Liu
*Assistant Examiner* — Sung Ahn
(74) *Attorney, Agent, or Firm* — Foley & Lardner LLP

(57) ABSTRACT

An adaptive digital filter is provided with a filter unit for generating and supplying an output signal by means of a convolution operation of an input signal and a filter coefficient, or a filter unit for taking as input signal a complex signal in which one of two signals that are generated from one real signal and that have phases that differ by 90° is a real part and the other signal is an imaginary part for generating and supplying an output signal that is a complex signal by means of a convolution operation of the input signal and a filter coefficient that is the real signal; and the update amount of the filter coefficient is controlled based on the estimated value of the amplitude of at least one of the input signal and output signal of the adaptive digital filter.

4 Claims, 35 Drawing Sheets

U.S. PATENT DOCUMENTS

| | | | |
|---|---|---|---|
| 5,260,896 A * | 11/1993 | Iwasaki | 708/322 |
| 6,950,842 B2 * | 9/2005 | Lis | 708/322 |
| 7,333,605 B1 * | 2/2008 | Zhang et al. | 379/406.08 |
| 2001/0016004 A1 * | 8/2001 | Kim | 375/233 |
| 2003/0058976 A1 * | 3/2003 | Ohta et al. | 375/350 |
| 2005/0053177 A1 * | 3/2005 | Yamamoto et al. | 375/350 |
| 2005/0123035 A1 | 6/2005 | Yamamoto et al. | |

FOREIGN PATENT DOCUMENTS

| | | |
|---|---|---|
| JP | 09-162783 | 6/1997 |
| JP | 10-098419 | 4/1998 |
| JP | 2000-286763 A | 10/2000 |
| JP | 2003-248673 A | 9/2003 |
| JP | 2005-064618 A | 3/2005 |
| JP | 2005-167717 A | 6/2005 |

OTHER PUBLICATIONS

C.R. Johnson Jr. et al., "Blind Equalization Using the Constant Modulus Criterion: A Review," Proceedings of the IEEE, vol. 86:10, Oct. 1998, pp. 1927-1950.

M. Itami et al., "Hardware Implementation of FM Multipath Distortion Chanceller,", 1986.

* cited by examiner

FIG. 5
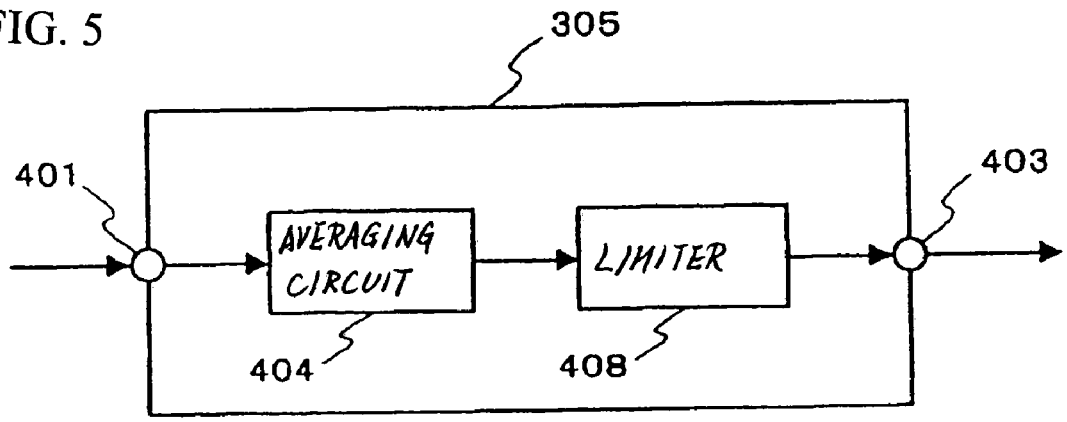
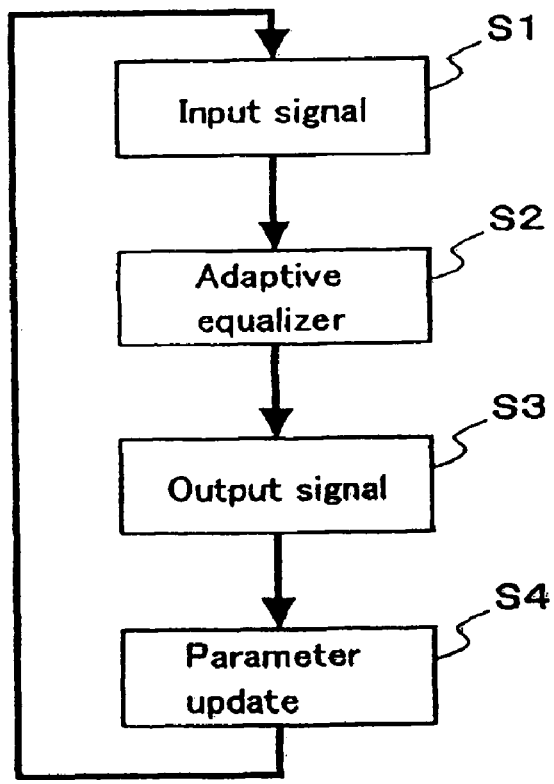
FIG. 6

US 8,223,829 B2

ADAPTIVE DIGITAL FILTER, SIGNAL PROCESSING METHOD, FM RECEIVER, AND PROGRAM

This application is the National Phase of PCT/JP2006/314051, filed Jul. 14, 2006, which claims priority to Japanese Application No. 2005-206721, filed Jul. 15, 2005, the disclosures of which are hereby incorporated by reference in their entirety.

TECHNICAL FIELD

The present invention relates to an adaptive digital filter, and more particularly to an adaptive digital filter suitable for a multipath equalizer of an FM (Frequency Modulation) receiver.

BACKGROUND ART

FM modulated waves used in FM radio broadcasting and television broadcasting are signals in which a sine-wave carrier signal is subjected to phase modulation by a music signal. FM modulated waves have high resistance against noise and can transmit music signals having a wide band of 15 kHz with a low distortion factor. However, when there are multipath propagation paths, which are paths in which radio waves arrive with a delay due to reflection by obstructions such as buildings, in addition to the path by which radio waves arrive directly, the influence of strong reflected waves that are received together with direct waves disturbs the phase information required for demodulation, and distortion therefore occurs in the demodulated signal.

This distortion that is produced as a result of multipath propagation paths is referred to as "multipath distortion". An equalizer for reducing multipath distortion by compensating for the characteristics of the multipath propagation paths is referred to as a "multipath equalizer" or a "multipath distortion canceller".

A multipath equalizer reduces the influence of multipaths by passing the received signal through a filter having the inverse characteristics of the multipath propagation paths, i.e., an inverse filter. The characteristics of the multipath propagation paths change according to the communication environment, and the characteristics of the inverse filter must therefore be optimized according to the conditions over time. As a result, adaptive digital filters are typically used for inverse filters.

An adaptive digital filter is a filter having the capability for automatically updating the filter coefficients according to changes in the communication environment. An algorithm for calculating filter coefficients at each point in time is referred to as an "adaptive algorithm," an LMS (Least Mean Square) algorithm being a representative example.

In a broad sense, an LMS algorithm is a method of minimizing the mean-square error based on a steepest-descent method and offers the advantages of stability and a small amount of operations. There are also algorithms referred to as "normalized LMS algorithms" in which the coefficient correction term of an LMS algorithm is normalized by the state vector norm of the filter. However, a normalized LMS algorithm has the drawback of requiring a greater amount of calculation than an LMS algorithm.

There are also adaptive algorithms known as "complex LMS algorithms". A complex LMS algorithm is an expansion of the LMS algorithm when each of the input signal, output signal, target signal, and the filter coefficients are complex amounts, and is used, for example, when the input signal is a narrow-band high-frequency signal and adaptation is realized by separating the in-phase component and quadrature component of the input signal.

A conventional equalizer that uses an adaptive digital filter requires a reference signal (training signal) for adaptation, and this requirement tends to bring about a reduction of communication efficiency due to interruptions in communication and the transmission and reception of reference signals that do not contribute to the transmission of user data. In contrast, a recently developed equalizer known as a "blind equalizer" performs restorative equalization of signals based only on the received signals without requiring a reference signal for adaptation. Algorithms suitable for such blind equalization are referred to as "blind algorithms," a CMA (Constant Modulus Algorithm) being a representative example.

As disclosed in C. Richard Johnson, Jr., Philip Schniter, Thomas J. Endres, James D. Behm, Donald R. Brown, and Raul A. Casas, "Blind Equalization Using the Constant Modulus Criterion: A Review" (Proceedings of IEEE, Vol. 86, No. 10, October 1998) (hereinbelow referred to as "Non-Patent Document 1"), CMA typically refers to an algorithm that takes as an index a statistic relating to the output signal such as the envelope of the filter output or a higher-order statistic and that updates filter coefficients such that this index approaches a target value. As disclosed in: J. R. Treichler and B. G. Agee, "A New Approach to Multipath Correction of Constant Modulus Signals" (IEEE Transactions on Acoustics, Speech, and Signal Processing, Vol. 31, No. 2, pp. 459-472, April 1983) (hereinbelow referred to as "Non-Patent Document 2"), when using a constant-amplitude modulated wave in which the amplitude of the modulated wave is fixed, as in FM modulation, the envelope of the filter output, i.e., the amplitude, is used as the index, and the filter coefficient is updated to minimize the error between a target value and the value of the envelope of the signal following passage through the filter. In this way, distortion of phase is corrected together with the distortion of the envelope, and the influence of the reflected waves of multipath propagation paths is eliminated.

CMA is a different concept than an adaptive algorithm. In CMA, an adaptive algorithm such as the previously mentioned LMS algorithm is used as an adaptive algorithm for calculating filter coefficients at each time point.

In order to control the value of the envelope of the output signal of a filter to a uniform value as described above, the value of the envelope must be extracted instantaneously, and complex signal processing is a representative method of this type of extraction. In complex signal processing, a real signal f2 having phase that is delayed 90° ($\pi/2$) with respect to a particular real signal f1 is generated by, for example, a Hilbert transformer, whereby a complex signal (typically referred to as an "analytic signal") having f1 as a real part and f2 as an imaginary part is generated. When this type of complex signal is generated in this way, the value of the envelope of this real signal can be found instantaneously by calculating the square sum of the real part and imaginary part of the complex signal. However, when the output signal of the filter is subjected to complex signal processing, delay caused by the complex signal processing in the coefficient updating loop gives rise to instability of the loop, and complex signal processing is therefore preferably carried out upon the input signal. In this case, the input signal becomes a complex signal, and an algorithm that can handle complex quantities such as a complex LMS algorithm is therefore used as the adaptive algorithm. This method is hereinbelow referred to as the "first technique of the background art".

FIG. 1 shows the configuration of an adaptive digital filter that uses the first technique of the background art.

Input signal X(k) shown in FIG. 1 is converted to a complex signal by a Hilbert transformer (not shown). Complex filter coefficient vector W(k) is convoluted with this complex signal as input to obtain output signal y(k), which is a complex signal. Complex filter coefficient vector W(k) is updated by an adaptive algorithm that has been expanded to handle complex signals such that the value of the envelope of output signal y(k) approaches a target value that has been prescribed in advance. The algorithm of this adaptive digital filter is represented as shown below:

$$W(k+1) = W(k) - \mu(|y(k)|^p - yref0)^q y(k) X^H(k) \quad (1)$$

$$y(k) = W^T(k) X(k) \quad (2)$$

$$W(k) = [w_0(k), w_1(k), \ldots, w_{N-1}(k)]^T \quad (3)$$

$$X(k) = [x(k), x(k-1), \ldots, x(k-N+1)]^T \quad (4)$$

where W(k) represents a filter coefficient vector, X(k) represents a complex signal vector, k represents a sample index, N represents the number of filter taps, y(k) represents the output signal, yref0 represents the envelope target value, and μ represents a parameter for determining the amount of update of the filter coefficients. In addition, H represents a complex conjugate transposition, and T represents a transposition. The values p and q are constants for determining an evaluation function of error with respect to the envelope target value, and for example, may be p=1 and q=1.

In the first technique of the background art, two signals having phases shifted 90° (π/2) with respect to each other are generated by applying complex signal processing. However, as can be seen from Patent Document 1 (JP-A-2005-064618) and Non-Patent Document 3 (Itami Makoto, Hatori Mitsutoshi, Tsukamoto Norio, "Hardware Implementation of FM Multipath Distortion Canceller," National Convention Record of the Institute of Television Engineers of Japan, pp. 355-356, 1986), if sampling is carried out at a frequency of (4/odd number) times the carrier frequency when sampling the input signal, the phases of adjacent sample points will be shifted 90°. By taking this approach, an adaptive algorithm for handling real numbers can be used as is, and the square sum of adjacent sample points can be calculated when seeking the value of the envelope of the output. This method is hereinbelow referred to as the "second technique of the background art".

FIG. 2 shows the configuration of an adaptive digital filter that uses the second technique of the background art.

Input signal Xr(k) shown in FIG. 2 is a real signal, and the real-signal filter coefficient vector Wr(k) is convoluted with this real signal as input to obtain real-signal output signal yr(k). Filter coefficient vector Wr(k) is updated by an adaptive algorithm that handles real coefficients such that the envelope of output signal yr(k) approaches a target value that has been prescribed in advance. This adaptive digital filter algorithm is represented as shown below:

$$Wr(k+1) = Wr(k) - \mu(Env[yr(k)] - yref0) yr(k) Xr(k) \quad (5)$$

$$yr(k) = Wr^T(k) Xr(k) \quad (6)$$

$$Env[yr(k)] = (yr^2(k-1) + yr^2(k))^{1/2} \quad (7)$$

$$Wr(k) = Re[W(k)] \quad (8)$$

$$Xr(k) = Re[X(k)] \quad (9)$$

where Wr(k) represents a real coefficient vector, Xr(k) represents a real signal vector, Env[ ] represents an operation for obtaining an approximate value of the envelope, Re[ ] represents an operation for extracting the real part of the complex number, and yr(k) represents a real-number output signal.

The envelope target value yref0 is basically a constant, but in Patent Document 1, the envelope target value is set according to the amplitude of the input signal of the adaptive digital filter to eliminate the influence of Doppler fading contained in a received wave and thus stabilize the adaptive process. More specifically, the amplitude of the input signal is found by calculating the square sum of adjacent sample points in the input signal, and the amplitude of this signal after having been passed through an LPF (Low-Pass Filter) is taken as the envelope target value.

The problems of the above-described adaptive digital filter of the background art are requirements of a large amount of operations and the large-scale hardware. The reasons for these problems are as described below.

As a first reason, the amount of update of a filter coefficient is proportional to the level of the input signal. When the amount of update of a filter coefficient is proportional to the level of the input signal, the amount of update of a filter coefficient is large when a large input signal is received as input, and the filter coefficient overflows. As a means of preventing this overflow, highly accurate operations are required for the filter coefficients operations, for example, by representing filter coefficients with a floating point or by increasing the number of bits when using a fixed point. However, highly accurate operations require a large amount of operations and increase the scale of hardware.

As a second reason, the range of fluctuation of filter coefficients is extremely broad. For example, when the envelope target value is "1" and the input signal amplitude is "1", the filter coefficient has a value on the order of "1," but when the input signal amplitude is "0.01," the filter coefficient has a value on the order of "100". In order to accurately express filter coefficients having this broad range of fluctuation without causing overflow requires highly accurate operations for the filter coefficient operations, and this leads to an increase in the amount of operations and an increase in the scale of hardware.

As a third reason, complex signals are being processed. In other words, in the adaptive digital filter shown in FIG. 1, almost all signal processing for input signal X(k), filter coefficient vector W(k), and output signal y(k) is carried out by complex numbers. One multiplication of complex numbers is equivalent to four multiplications and two additions of real numbers. In a multipath equalizer for an FM receiver, convolution operations and coefficient updating operations of a filter having a large number of taps must be carried out for each short sampling cycle, and the amount of operations is therefore voluminous.

In the adaptive digital filter shown in FIG. 2, if the sampling frequency is a precise multiple of (4/odd number) as seen from the center frequency of an intermediate frequency signal, the calculation accuracy of the envelope will be high, performance equivalent to the adaptive digital filter shown in FIG. 1 will be obtained, and the amount of operations can be cut to approximately 25%. However, severe limitations are placed on the sampling frequency, and this raises the different problem of preventing freedom of design for any sampling frequency. When the sampling frequency diverges from a multiple of (4/odd number) of the center frequency of the intermediate frequency signal, the calculation accuracy of the envelope drops and the performance of the multipath equalizer itself deteriorates.

DISCLOSURE OF THE INVENTION

It is therefore an object of the present invention to provide an adaptive digital filter that can reduce the amount of operations.

It is another object of the present invention to provide an adaptive digital filter in which limitations are not placed on the sampling frequency.

The present invention for achieving the above-described objects is provided with: a filter unit for generating an output signal by a convolution operation of an input signal and filter coefficients and supplying the result as output, or a filter unit for taking as input signal a complex signal in which one of two signals that are generated from a single real signal and that have phases that differ by 90° from each other is a real part and the other signal is an imaginary part, generating an output signal that is a complex signal by a convolution operation of the input signal and the filter coefficients that are the real signals, and supplying the result as output; wherein the filter coefficients are controlled based on the error between a target signal and an index value derived from the output signal; and moreover, wherein the amount of update of the filter coefficients is controlled based on the estimated value of the amplitude of at least one of the input signal and output signal of the adaptive digital filter.

In a configuration of this type, the filter coefficients are small even when the input signal level is extremely high, and as a result, the amount of update of the filter coefficients is not large and the filter coefficients themselves do not attain large values. Accordingly, the need for higher accuracy for preventing overflow in operations in which filter coefficients vary over a broad range of values is eliminated, the amount of operations can be decreased, and the scale of hardware can be reduced.

An index value such as the value of the envelope can be calculated from each of the output signals that are complex signals, whereby the sampling frequency can be set to any value and no limitations are placed on sampling frequency as in the second technique of the background art.

BRIEF DESCRIPTION OF THE DRAWINGS

FIG. 5 is a block diagram showing an example of the configuration of the envelope target value generation circuit used in the adaptive digital filter of the first embodiment.

FIG. 6 is a flow chart showing the operations of the adaptive digital filter of the first embodiment.

BEST MODE FOR CARRYING OUT THE INVENTION (First Embodiment)

Figure 3:
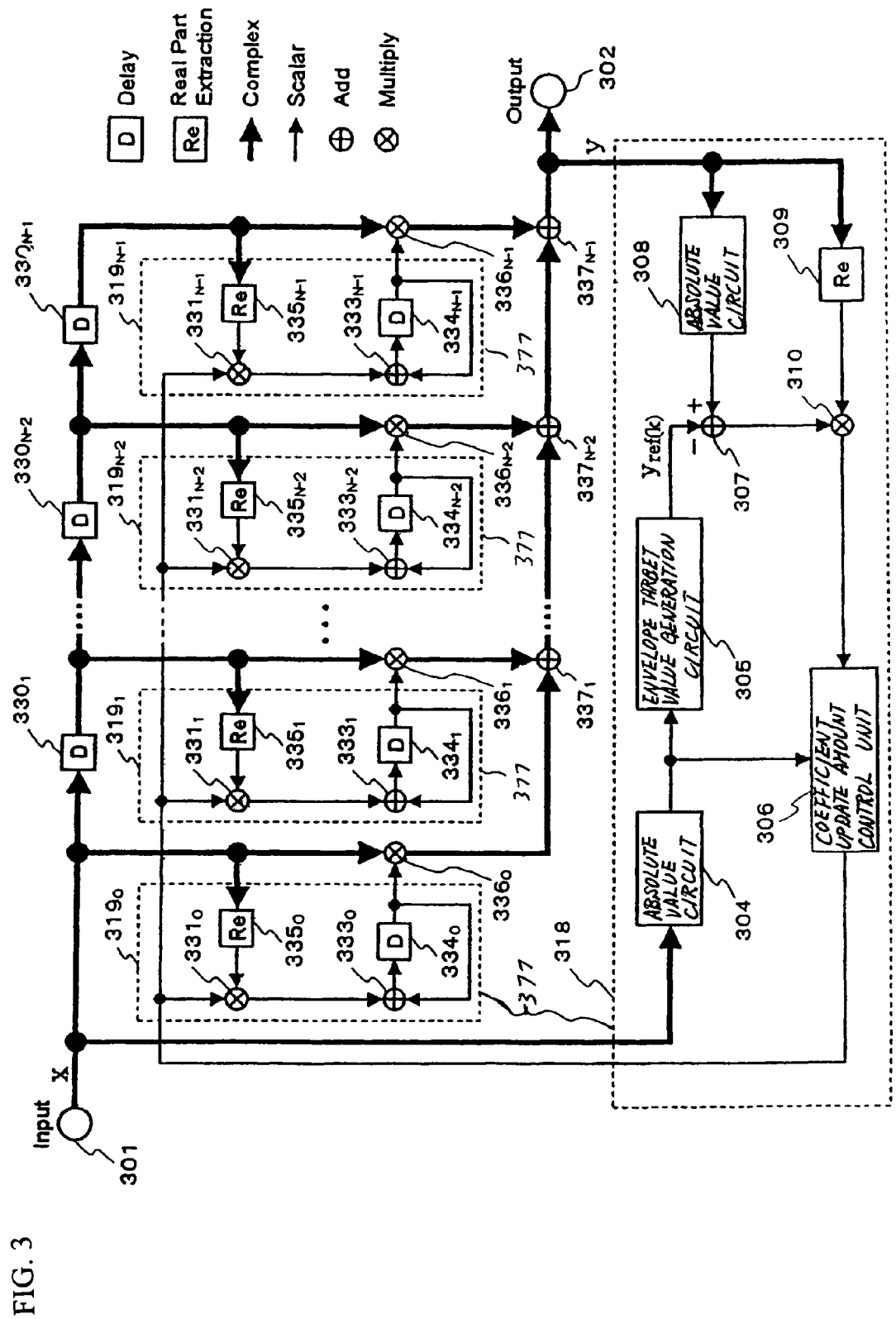
FIG. 3 is a block diagram showing the configuration of the first embodiment of the adaptive digital filter of the present invention.

As shown in FIG. 3, the adaptive digital filter of the first embodiment is of a configuration that includes: a filter unit for generating an output signal that is a complex signal (a complex output signal) by means of a convolution operation of a complex signal (complex input signal) that is received as input from input terminal 301 and the filter coefficients that are real numbers (real filter coefficients) and supplying the result from output terminal 302; and a coefficient control unit for controlling filter coefficients based on error between a target signal and an index value derived from the complex output signal (in the present embodiment, the value of the envelope).

The coefficient control unit 377 is made up from block 318 and N blocks $319_0$-$319_{N-1}$ shown in FIG. 3, and the filter unit is made up from the remaining blocks. In this case, the complex input signal is a complex signal in which one of two signals that are generated from a single real signal and that have phases that differ from each other by 90° is a real part and the other signal is an imaginary part.

The filter unit is an FIR (Finite Impulse Response) filter having a tap number of N, i.e., having N filter coefficients, and is of a configuration that includes: tapped delay line composed of N−1 delay units $330_1$-$330_{N-1}$ for delaying signals by one sampling cycle, N multipliers $336_0$-$336_{N-1}$ for multiplying filter coefficients by the complex input signal and the output signals of delay units $330_1$-$330_{N-1}$, and N−1 adders $337_1$-$337_{N-1}$ for successively adding the multiplication results of these N multipliers $336_0$-$336_{N-1}$.

The coefficient control unit uses LMS as the adaptive algorithm and is provided with common unit 318 for controlling all filter coefficients and separate units $319_0$-$319_{N-1}$ for controlling each individual filter coefficient.

Common unit 318 is of a configuration that includes: absolute value circuit 304 for calculating and supplying the value of the envelope of the complex input signal (i.e., the amplitude value) from the square sum of the real part and imaginary part; envelope target value generation circuit 305 for generating the envelope target value based on the amplitude value of the input signal that is supplied from absolute value circuit 304; absolute value circuit 308 for calculating and supplying the value of the envelope of the complex output signal that is the output of the filter unit from the square sum of the real part and imaginary part; subtractor 307 for supplying the value obtained by subtracting the envelope target value from the value of the envelope found in absolute value circuit 308; real-part extraction circuit 309 for extracting and supplying only the real part of the complex output signal; multiplier 310 for supplying the result of multiplying the output signal of subtractor 307 and the output signal of real-part extraction circuit 309; and coefficient update amount control unit 306 for calculating a coefficient update amount based on the output signal of multiplier 310 and the amplitude value of the input signal supplied from absolute value circuit 304 and supplying this result to separate units $319_0$-$319_{N-1}$.

Separate units $319_0$-$319_{N-1}$ are provided with: real-part extraction circuits $335_0$-$335_{N-1}$ for extracting and supplying as output only the real parts from the complex input signal or the output signals of corresponding delay units $330_1$-$330_{N-1}$ on the tapped delay line; multipliers $331_0$-$331_{N-1}$ for supplying the results obtained by multiplying the signal supplied from common unit 318 and the real parts extracted by real-part extraction circuits $335_0$-$335_{N-1}$; adders $333_0$-$333_{N-1}$ for adding the filter coefficients that are supplied to multipliers $336_0$-$336_{N-1}$ and the outputs of multipliers $331_0$-$331_{N-1}$ and supplying the filter coefficients to be used in the next sampling cycle; and delay units $334_0$-$334_{N-1}$ for delaying the outputs of adders $333_0$-$333_{N-1}$ by one sampling cycle and supplying the results to multipliers $336_0$-$336_{N-1}$.

Coefficient update amount control unit 306 has the function of reducing the coefficient update amount when the amplitude of the input signal supplied by way of input terminal 301 is too big. One example of the configuration of coefficient update amount control unit 306 is shown in FIG. 4.

Figure 4:
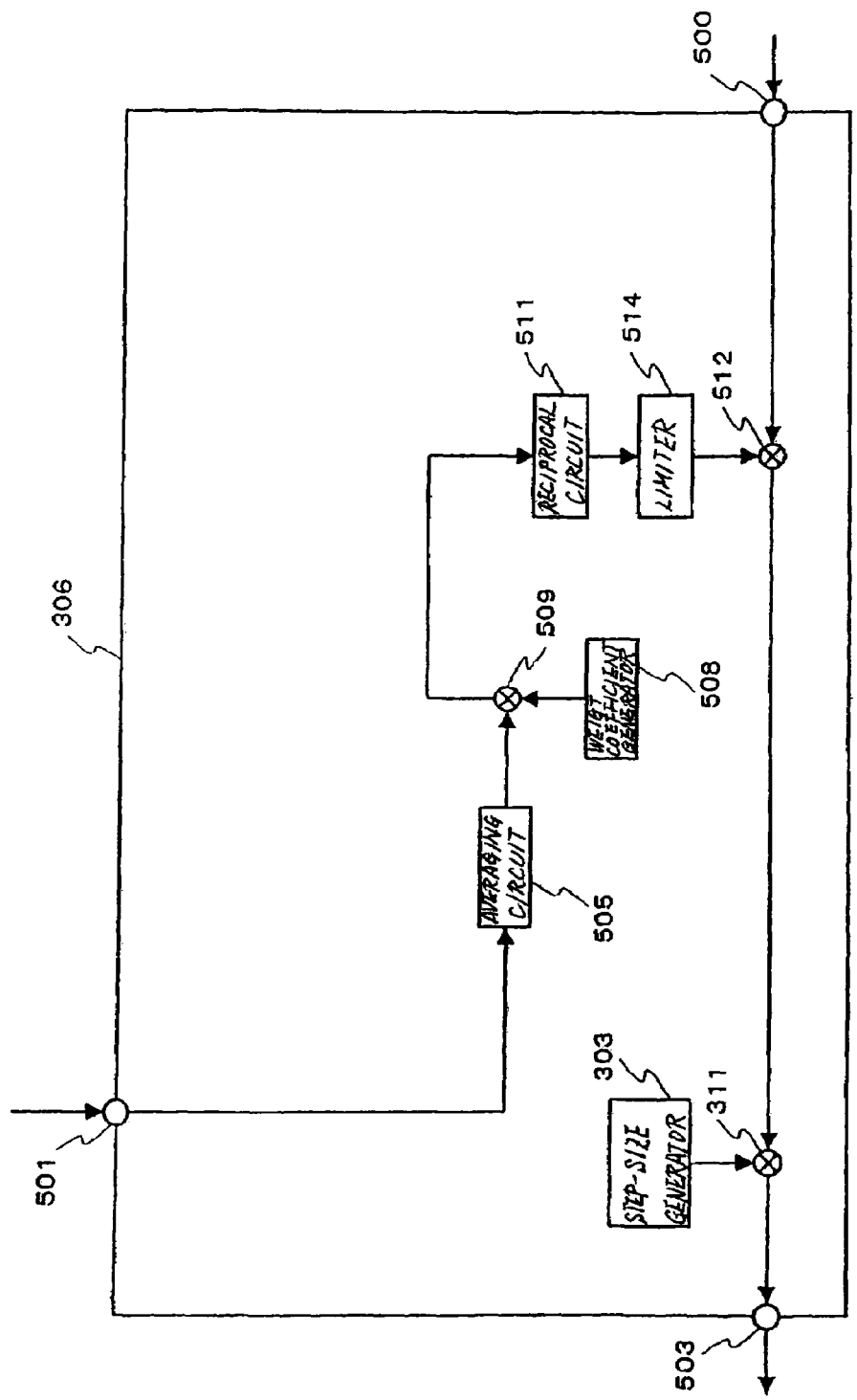
FIG. 4 is a block diagram showing an example of the configuration of the coefficient update amount control unit used in the adaptive digital filter of the first embodiment.

As shown in FIG. 4, the output signal of multiplier 310 shown in FIG. 3 is supplied by way of input terminal 500 to multiplier 512 that is provided in coefficient update amount control unit 306. Multiplier 512 multiplies the signal supplied as input from input terminal 500 by a signal supplied from limiter 514 and supplies the result to multiplier 311. Multiplier 311 multiplies the signal supplied from multiplier 512 by a value supplied from step-size generator 303 and supplies the result to output terminal 503. The signal from output terminal 503 is supplied to separate units $319_0$-$319_{N-1}$ shown in FIG. 3.

The output signal of absolute value circuit 304 of FIG. 3 is supplied to averaging circuit 505 by way of input terminal 501. Averaging circuit 505 calculates the time average of the signal supplied as input from input terminal 501 and supplies the result as the estimated value of the amplitude of the input signal to multiplier 509. Multiplier 509 multiplies the signal supplied from averaging circuit 505 by a value supplied from weight coefficient generator 508 and supplies the result to reciprocal circuit 511. Reciprocal circuit 511 calculates the reciprocal of the signal supplied from multiplier 509 and supplies the calculation result to limiter 514. Limiter 514 effects control such that the value supplied from reciprocal circuit 511 falls between upper and lower limits that have been set in advance and supplies this result to multiplier 512.

Envelope target value generation circuit 305 generates a small envelope target value when the amplitude of the input signal is small and generates a large envelope target value when the amplitude of the input signal is large. An example of the configuration of envelope target value generation circuit 305 is shown in FIG. 5.

As shown in FIG. 5, envelope target value generation circuit 305 is provided with: averaging circuit 404 for finding the weighting average of signals of a past fixed time interval that have been supplied from absolute value circuit 304 by way of input terminal 401; and limiter 408 for limiting the value found in averaging circuit 404 to fall between upper and lower limits that have been set in advance and supplying the result as the time-variable envelope target value from output terminal 403.

When controlling the target signal based on the amplitude of the input signal, envelope target value generation circuit 305 makes the target signal smaller as the amplitude of the input signal decreases and makes the target signal larger as the amplitude of the input signal increases, the speed at which the target signal is made smaller being faster than the speed at which the target signal is made larger.

The algorithm of the adaptive digital filter of the first embodiment is expressed as follows:

$$Wr(k+1)=Wr(k)-\mu\gamma(|y(k)|^p-yref(k))^q Re[y(k)]Re[X(k)]\quad(10)$$

$$y(k)=Wr^T(k)X(k)\quad(11)$$

$$yref(k)=Av[|x(k)|]\quad(12\text{-}1)$$

$$Av[|x(k)|]=(1-\beta)Av[|x(k-1)|]+\beta|x(k)|\quad(12\text{-}2)$$

where $Wr(k)$ is a real coefficient vector, $X(k)$ is a complex signal vector, $Re[\ ]$ represents the operation of extracting the real part of a complex number, $y(k)$ is complex output signal, k is a sample index, N is the number of filter taps, yref is a time-variable envelope target value, $\mu$ is a step size that is a parameter for determining the update amount of a filter coefficient, $Av[\ ]$ is an operation for carrying out averaging, $\beta$ is a weight coefficient that is positive constant satisfying the relation $0<\beta<1$, and $\gamma$ is a parameter that is substantially proportional to the reciprocal of the amplitude of the input signal and that corresponds to the output of limiter 514 shown in FIG. 4. In addition, p and q are constants for determining an evaluation function of the error with respect to the envelope target value and can be, for example, p=1 and q=1.

In the first embodiment, the filter coefficients are real numbers and not complex numbers, and the step size p is therefore set to approximately four times the step size when using complex filter coefficients. In this way, the convergence speed can be made equivalent to a case of using complex filter coefficients.

Explanation next regards the operation of the adaptive digital filter of the first embodiment.

FIG. 6 is a flow chart showing the operations of the adaptive digital filter of the first embodiment.

As shown in FIG. 6, in the adaptive digital filter of the first embodiment, input process S1 of a new complex input signal from input terminal 301, adaptive equalizing process S2, output process S3 of the complex output signal to output terminal 302, and parameter updating process S4 are executed repeatedly.

Adaptive equalizing process S2 is a process based on the above-described Equation (11), and parameter updating process S4 is a process based on the above-described Equation (10). Explanation next regards each of these operations.

Explanation first regards adaptive equalizing process S2.

In adaptive equalizing process S2, a complex input signal received as input from input terminal 301 is both supplied to multiplier $336_0$ and real-part extraction circuit $335_0$ and supplied to the tapped delay line composed of delay units $330_1$-$330_{N-1}$ that delay by one sampling cycle.

The complex signal supplied to delay units $330_1$-$330_{N-1}$ is transmitted to an adjacent delay unit for each clock, and the output signals of delay units $330_1$-$330_{N-1}$ are supplied to corresponding multipliers $336_1$-$336_{N-1}$ and corresponding real-part extraction circuits $335_1$-$335_{N-1}$.

Multiplier $336_0$ multiplies the complex signal received as input from input terminal 301 by the real-number filter coefficient supplied from delay unit $334_0$ and supplies the result to adder $337_1$. Multipliers $336_1$-$336_{N-1}$ multiply the complex signals supplied from corresponding delay units $330_1$-$330_{N-1}$ by the real-number filter coefficients supplied from corresponding delay units $334_1$-$334_{N-1}$ and supplies the results to adders $337_1$-$337_{N-1}$.

Adders $337_1$-$337_{N-1}$ add all of the complex signals supplied from multipliers $336_0$-$336_{N-1}$ and supply the results both to output terminal 302 and to absolute value circuit 308 and real-part extraction circuit 309. In this way, an output signal that is a complex signal is generated by a convolution operation of the complex input signal and the filter coefficients that are the real signals.

Explanation next regards parameter updating process S4.

In parameter updating process S4, the amplitude value of the complex input signal is calculated by absolute value circuit 304 and supplied to envelope target value generation circuit 305 and coefficient update amount control unit 306. In envelope target value generation circuit 305, the result of multiplying the amplitude value supplied from absolute value circuit 304 by positive integer β and then averaging by means of averaging circuit 404 is supplied to limiter 408. Limiter 408 effects control such that the value does not surpass an excessive value and supplies the result as a time-variable envelope target value to subtractor 307.

Absolute value circuit 308 calculates the absolute value of the complex output signal that has been applied as input and supplies the result as the envelope value to subtractor 307. Subtractor 307 subtracts the envelope target value supplied from envelope target value generation circuit 305 from the signal supplied from absolute value circuit 308 and supplies the result to multiplier 310.

Real-part extraction circuit 309 extracts only the real part of the complex output signal that is received as input and supplies the result to multiplier 310. Multiplier 310 multiplies the signal supplied from subtractor 307 by the signal supplied from real-part extraction circuit 309 and supplies the result to coefficient update amount control unit 306.

Coefficient update amount control unit 306 multiplies the signal supplied from multiplier 310 and the signal supplied from limiter 514 by means of multiplier 512 and supplies the result to multiplier 311. Here, the output signal of limiter 514, having undergone the processing of averaging circuit 505, multiplier 509, and reciprocal circuit 511 becomes substantially the reciprocal of the estimated value of the amplitude of the input signal of the adaptive digital filter. Multiplier 311 multiplies the signal supplied from multiplier 512 with the step size generated in step-size generator 303 and supplies the result to separate units $319_0$-$319_{N-1}$.

Separate units $319_0$-$319_{N-1}$ supply the signal supplied from coefficient update amount control unit 306 to multipliers $331_0$-$331_{N-1}$. Real-part extraction circuits $335_0$-$335_{N-1}$ extract the real parts of the complex signals received as input from input terminal 301 or corresponding delay units $330_1$-$330_{N-1}$ and supply the results to corresponding multipliers $331_0$-$331_{N-1}$. Multipliers $331_0$-$331_{N-1}$ multiply the real-number signals supplied from corresponding real-part extraction circuits $335_0$-$335_{N-1}$ with the real-number signal supplied from common unit 318 and supply the results to corresponding adders $333_0$-$333_{N-1}$. Adders $333_0$-$333_{N-1}$ add the real-number filter coefficients supplied from corresponding delay units $334_0$-$334_{N-1}$ to the real-number signals supplied from corresponding multipliers $331_0$-$331_{N-1}$ and supply the results to corresponding delay units $334_0$-$334_{N-1}$ as the filter coefficients of the next sample. Delay units $334_0$-$334_{N-1}$ delay by one sampling cycle the real-number filter coefficients supplied from corresponding adders $333_0$-$333_{N-1}$ and supply the results both to corresponding multipliers $336_0$-$336_{N-1}$ and to corresponding adders $333_0$-$333_{N-11}$.

Explanation next regards the effects of the adaptive digital filter of the first embodiment.

The signal supplied as output to separate units $319_0$-$319_{N-1}$ from coefficient update amount control unit 306 that is provided in the adaptive digital filter of the first embodiment is proportional to the reciprocal of the estimated value of the amplitude of the input signal supplied by way of input terminal 301. In other words, when the amplitude of this input signal is too large, the signal becomes small. In separate units $319_0$-$319_{N-1}$, multiplication is carried out in multipliers $331_0$-$331_{N-1}$ that take as multiplicands the signal supplied from coefficient update amount control unit 306 and the real part of the input signal and the coefficient update amount thus found, and as a result, even when the input signal that is one multiplicand is large, the signal supplied from coefficient update amount control unit 306 that is the other multiplicand becomes small, thus decreasing the coefficient update amount and reducing the probability of overflow of the filter coefficient. Accordingly, the filter coefficients do not become large values even when the input signal is extremely large, and there is consequently no need for higher accuracy to prevent overflow in operations in which filter coefficients vary over a broad range of values, and as a result, the amount of operations can be decreased and the scale of hardware can be reduced.

In addition, the time-variant envelope target value generated by envelope target value generation circuit 305 is substantially proportional to the amplitude of the input signal supplied by way of input terminal 301. For example, when the input signal amplitude is "0.01," the envelope target value is a value on the order of "0.01". As a result, the filter coefficient will be a value on the order of "1". In other words, the filter coefficient does not become a large value even when the level of the input signal is small, and there is consequently no need for higher accuracy to prevent overflow in operations in which filter coefficients vary over a broad range of values, and as a result, the amount of operations can be decreased and the scale of hardware can be reduced.

Figure 1:
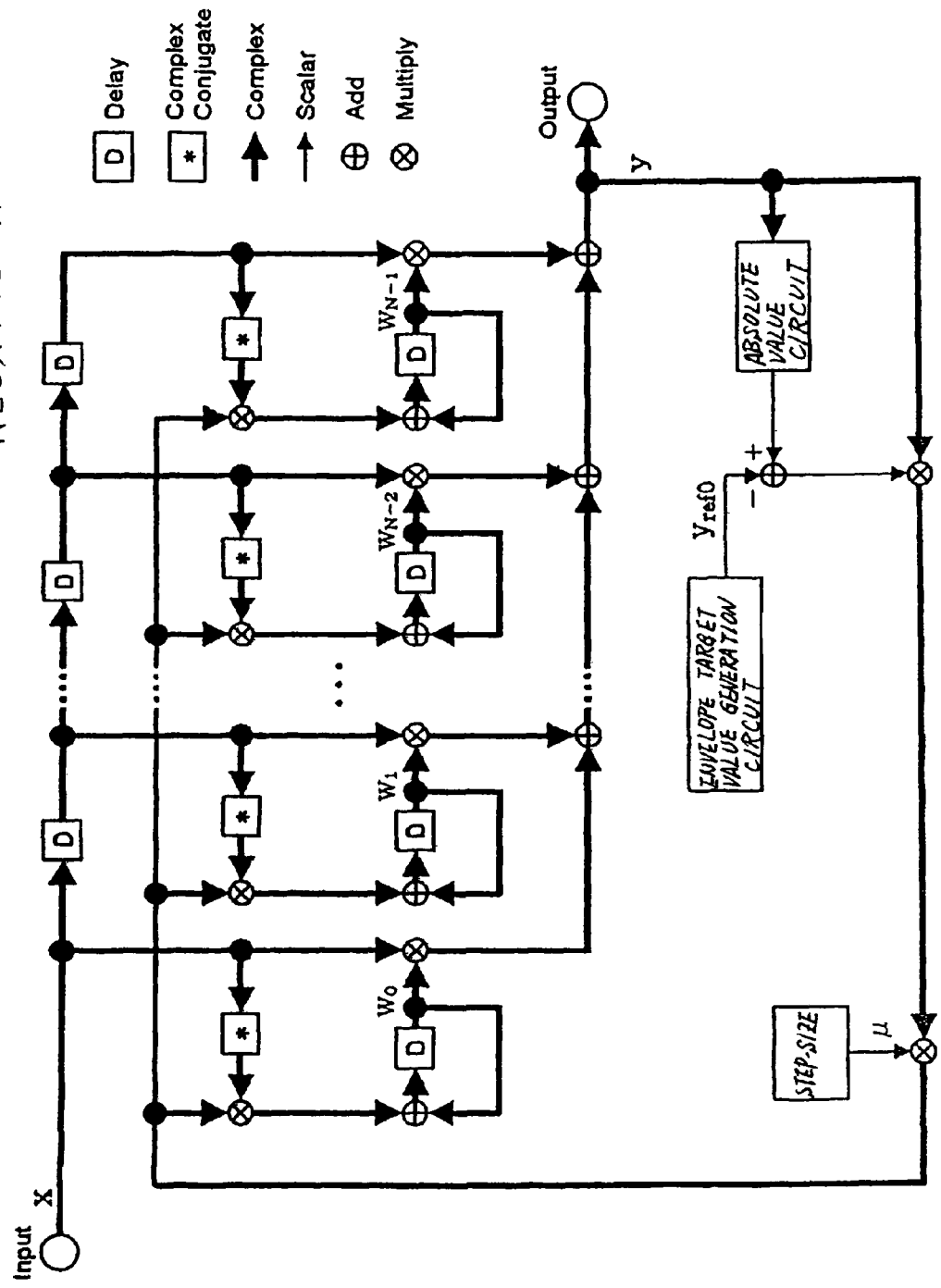
FIG. 1 is a block diagram showing the configuration of the adaptive digital filter of the first technique of the background art.
Figure 2:
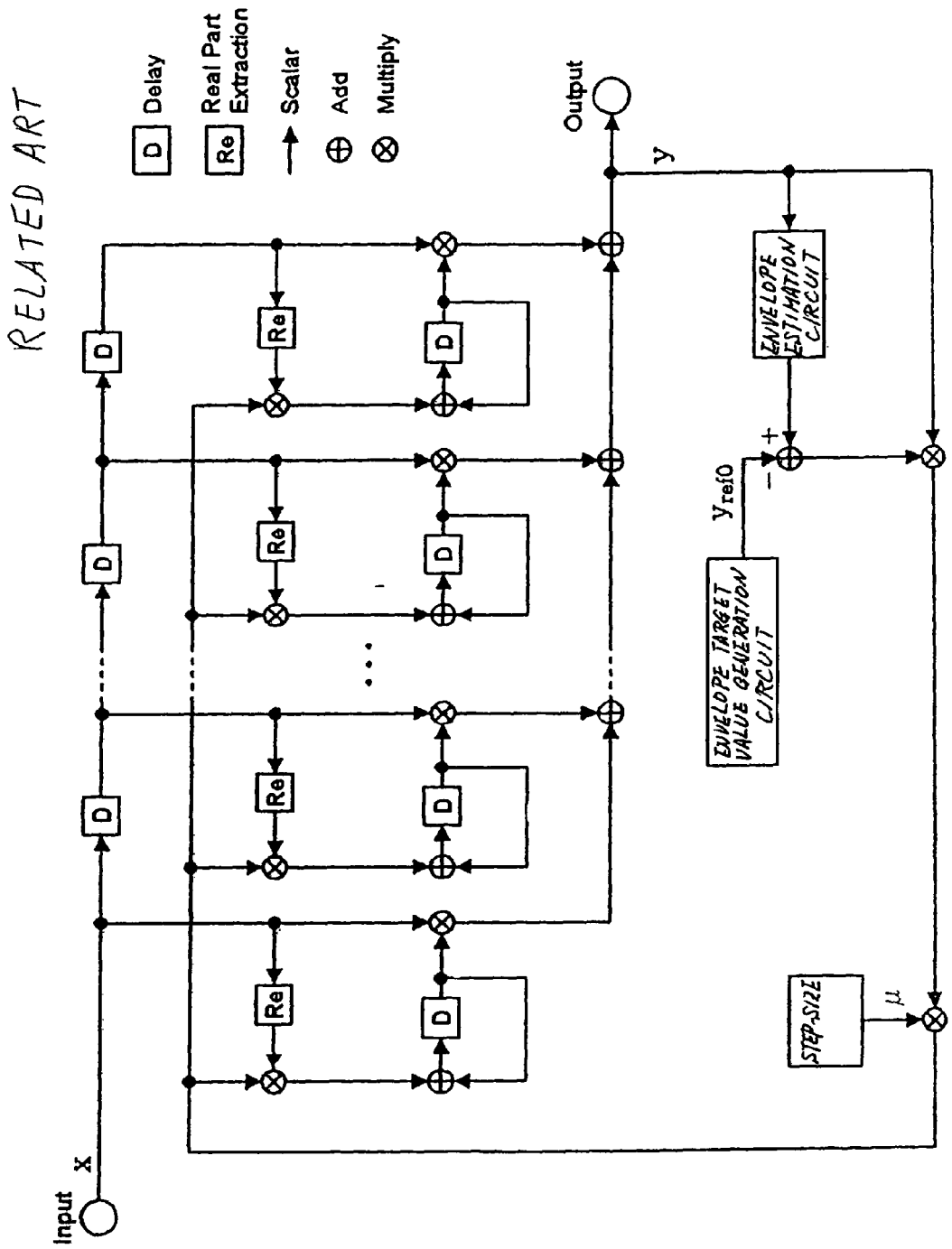
FIG. 2 is a block diagram showing the configuration of the adaptive digital filter of the second technique of the background art.

Further, as shown in FIG. 3, most signals in the adaptive digital filter of the first embodiment are real numbers and not complex numbers. Since signals are real numbers and not complex numbers, the amount of operations can be greatly reduced compared to the first technique of the background art shown in FIG. 1. This reduction can be realized because all signals are complex numbers in the adaptive digital filter of the first technique of the background art, and multiplication is therefore carried out between complex numbers in all multipliers. In contrast, multiplication is carried out between complex numbers and real numbers in multipliers $336_0$-$336_{N-1}$ and multiplication is carried out between real numbers in multipliers $331_0$-$331_{N-1}$ in the adaptive digital filter of the present embodiment. Multiplication between complex numbers is equivalent to four multiplications between real numbers and two additions between real numbers. In contrast, multiplication between a complex number and a real number is equivalent to just two multiplications between real numbers, and multiplication between real numbers is just one operation.

The substitution of multipliers $336_0$-$336_{N-1}$ that carry out multiplication between real numbers and complex numbers at locations in which multiplication is carried out between complex numbers in the first technique of the background art realizes a reduction in the amount of operations equivalent to N multiplications between real numbers. In addition, the substitution of multipliers $331_0$-$331_{N-1}$ that carry out multiplication between real numbers at locations in which multiplication is carried out between complex numbers in the first technique of the background art realizes a reduction in the amount of operations equivalent to 3N multiplications between real numbers, and further, a reduction in the amount of operations equivalent to 2N additions of real numbers. In addition, real-part extraction circuits $335_0$-$335_{N-1}$ required complex conjugators in the first technique of the background art, and the amount of operations can therefore be reduced to the extent that code of the imaginary parts need not be transmitted.

As shown in the foregoing explanation, the adaptive digital filter of the first embodiment can reduce the amount of operations to approximately 40% that of the first technique of the background art.

In the adaptive digital filter of the first embodiment, the output signal of the filter unit is obtained as a complex number, and the value of the envelope of the output signal, i.e., the amplitude, is therefore instantaneously and accurately obtained as the output signal of absolute value circuit 308 shown in FIG. 3. The present embodiment is therefore not subject to the limitation on sampling frequency that applies in the second technique of the background art. In other words, in the adaptive digital filter of the first embodiment, the filter coefficients are real numbers, but the input signal is a complex signal in which one of two signals that have phases that differ from each other by 90° is a real part and the other is an imaginary part, whereby the output signals generated by the convolution operation of the input signal and the filter coefficients also are complex signals in which one of two signals that have phases that differ from each other by 90° is a real part and the other is an imaginary part. Accordingly, the value of the envelope of the output signal can be found instantaneously and accurately as in the first technique of the background art, and the sampling frequency is not subject to limitations as in the second technique of the background art. In addition, taking real numbers as filter coefficients enables a great reduction of the amount of operations. The real part and imaginary part of the complex signal that is the input signal are signals generated from the same real signal and have phases that differ from each other by 90°, and the conversion to a complex signal has been implemented only to enable the instantaneous calculation of the value of the envelope of the output signals.

As a result, the filter performance of the adaptive digital filter does not suffer by comparison with the first technique of the background art that handles the real part and imaginary part of an input signal or with the second technique of the background art that handles only the real part (or imaginary part) of an input signal.

(Second Embodiment)

Figure 7:
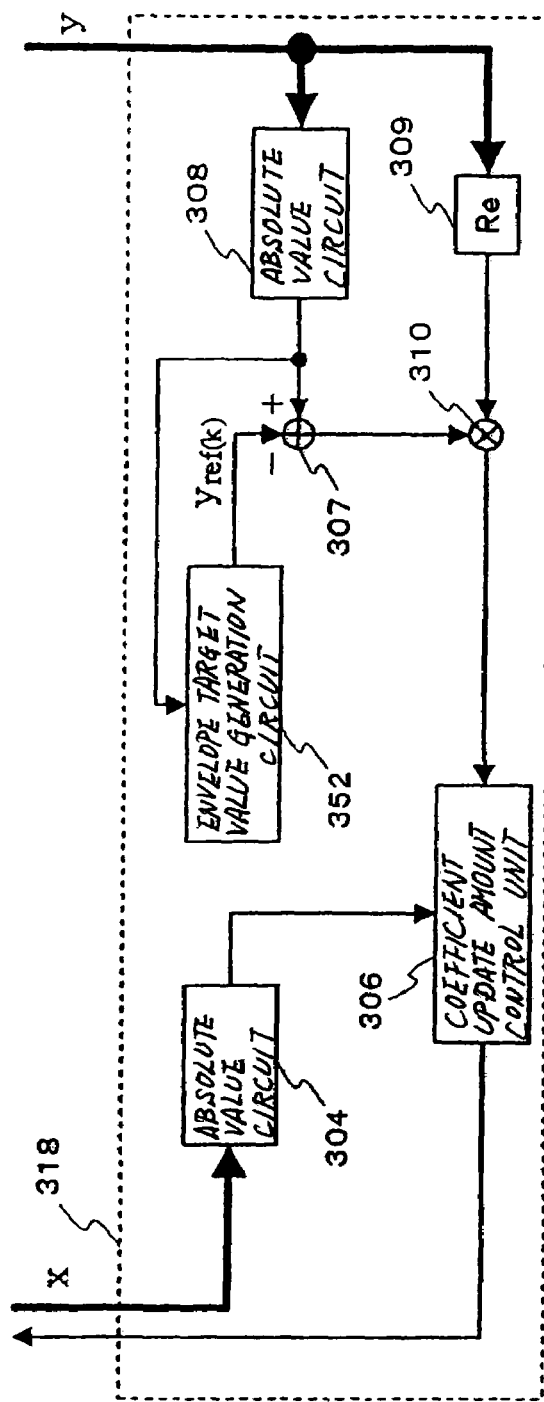
FIG. 7 is a block diagram showing the configuration of the principal elements of the second embodiment of the adaptive digital filter of the present invention.

As shown in FIG. 7, the adaptive digital filter of the second embodiment differs from the adaptive digital filter of the first embodiment in that the envelope target value is generated based on the output signal of the adaptive digital filter.

Envelope target value generation circuit 352 provided in the adaptive digital filter of the second embodiment generates an envelope target value based on the value of the envelope (i.e., the amplitude value) of the output signal of the adaptive digital filter that is found in absolute value circuit 308 and supplies this envelope target value as output to subtractor 307.

Envelope target value generation circuit 352 generates a small envelope target value when the amplitude of the output signal is large and generates a large envelope target value when the amplitude of the output signal is small. An example of the configuration of envelope target value generation circuit 352 is shown in FIG. 8.

Figure 8:
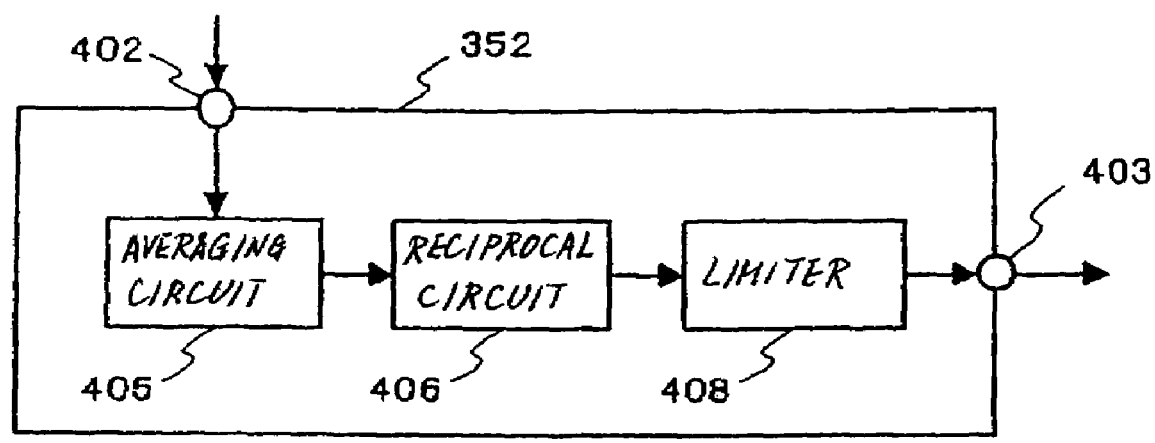
FIG. 8 is a block diagram showing an example of the configuration of the envelope target value generation circuit used in the adaptive digital filter of the second embodiment.

As shown in FIG. 8, envelope target value generation circuit 352 is of a configuration that includes: averaging circuit 405 for finding the weighting average of a signal of a past fixed time interval supplied from absolute value circuit 308 by way of input terminal 402; reciprocal circuit 406 for calculating the reciprocal of the value found in averaging circuit 405; and limiter 408 for effecting control such that the reciprocal calculated in reciprocal circuit 406 falls between an upper limit and lower limit that have been set in advance and supplying the result as a time-variable envelope target value by way of output terminal 403. In this case, envelope target value generation circuit 352 progressively decreases the target signal as the amplitude of the output signal increases, progressively increases the target signal as the amplitude of the output signal decreases, and makes the speed of decreasing the target signal faster than the speed of increasing the target signal.

The configuration is otherwise the same as in the first embodiment. In addition, the operations of the adaptive digital filter of the second embodiment are identical to those of the adaptive digital filter of the first embodiment with the exception of the operation of envelope target value generation circuit 352.

Explanation next regards the effects of the adaptive digital filter of the second embodiment.

The envelope target value generated by envelope target value generation circuit 352 provided in the adaptive digital filter of the second embodiment becomes smaller as the amplitude of the output signal of the adaptive digital filter increases. When the output signal increases, the values of internal signals or filter coefficients of the filter unit are highly likely to be large. Reducing the envelope target value causes the values of internal signals or filter coefficients to change to the direction of decrease. In other words, the values of internal signals or filter coefficients can be kept within a fixed range. Limiting these values to within a fixed range reduces the probability of the occurrence of overflow of the filter coefficients or internal signals. Accordingly, the adaptive digital filter of the second embodiment, as in the first embodiment, can dispense with the need for highly accurate operations that are required for preventing overflow when the values of filter coefficients vary over a wide range and can therefore decrease the amount of operations and reduce the scale of hardware.

In addition, as in the first embodiment, coefficient update amount control unit 306 reduces the coefficient update amount when the amplitude of the input signal is too great, whereby the probability of overflow of filter coefficients is reduced. Still further, the amount of operations required for the convolution operations of the input signal and filter coefficients can be reduced because the filter coefficients are real signals and not complex amounts.

(Third Embodiment)

Figure 9:
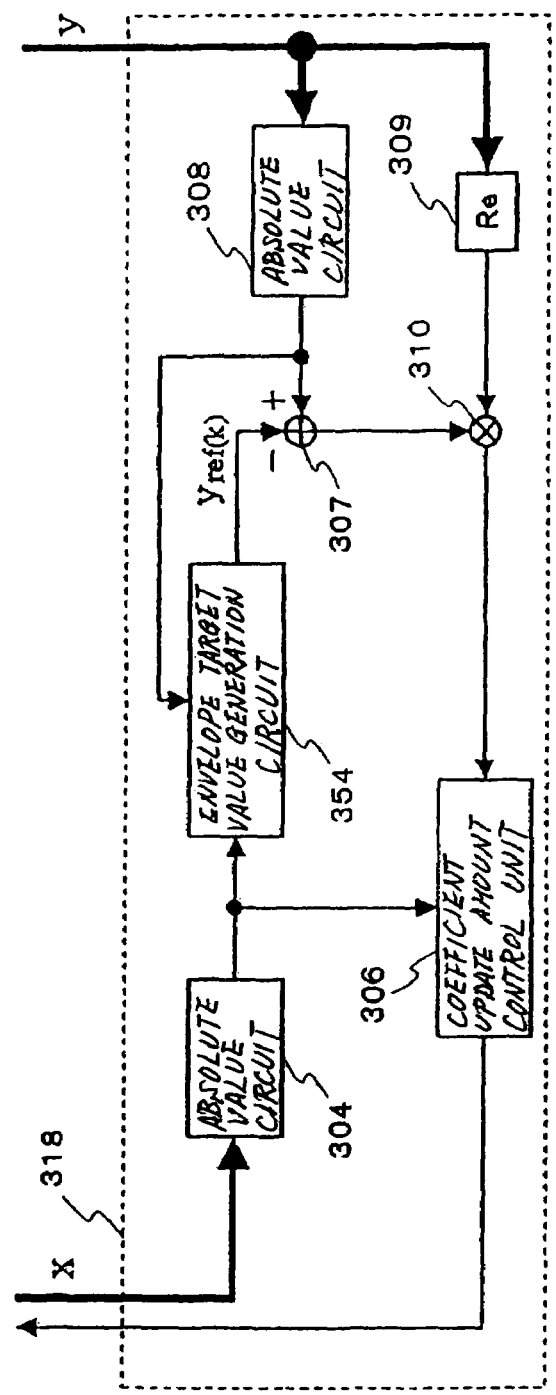
FIG. 9 is a block diagram showing the configuration of the principal elements of the third embodiment of the adaptive digital filter of the present invention.

As shown in FIG. 9, the adaptive digital filter of the third embodiment differs from the adaptive digital filter of the first embodiment in that the envelope target value is generated based on both the input signal and output signal of the adaptive digital filter.

Envelope target value generation circuit 354 provided in the adaptive digital filter of the third embodiment generates an envelope target value based on the value of the envelope (the amplitude value) of the input signal of the adaptive digital filter that has been found in absolute value circuit 304 and the value of the envelope (the amplitude value) of the output signal of the adaptive digital filter that has been found in absolute value circuit 308 and supplies the result to subtractor 307.

Envelope target value generation circuit 354 generates a small envelope target value when the amplitude of the input signal is small, and generates a large envelope target value when the amplitude of the input signal is large. Envelope target value generation circuit 354 further generates a small envelope target value when the amplitude of the output signal is large, and generates a large envelope target value when the amplitude of the output signal is small.

Figure 10:
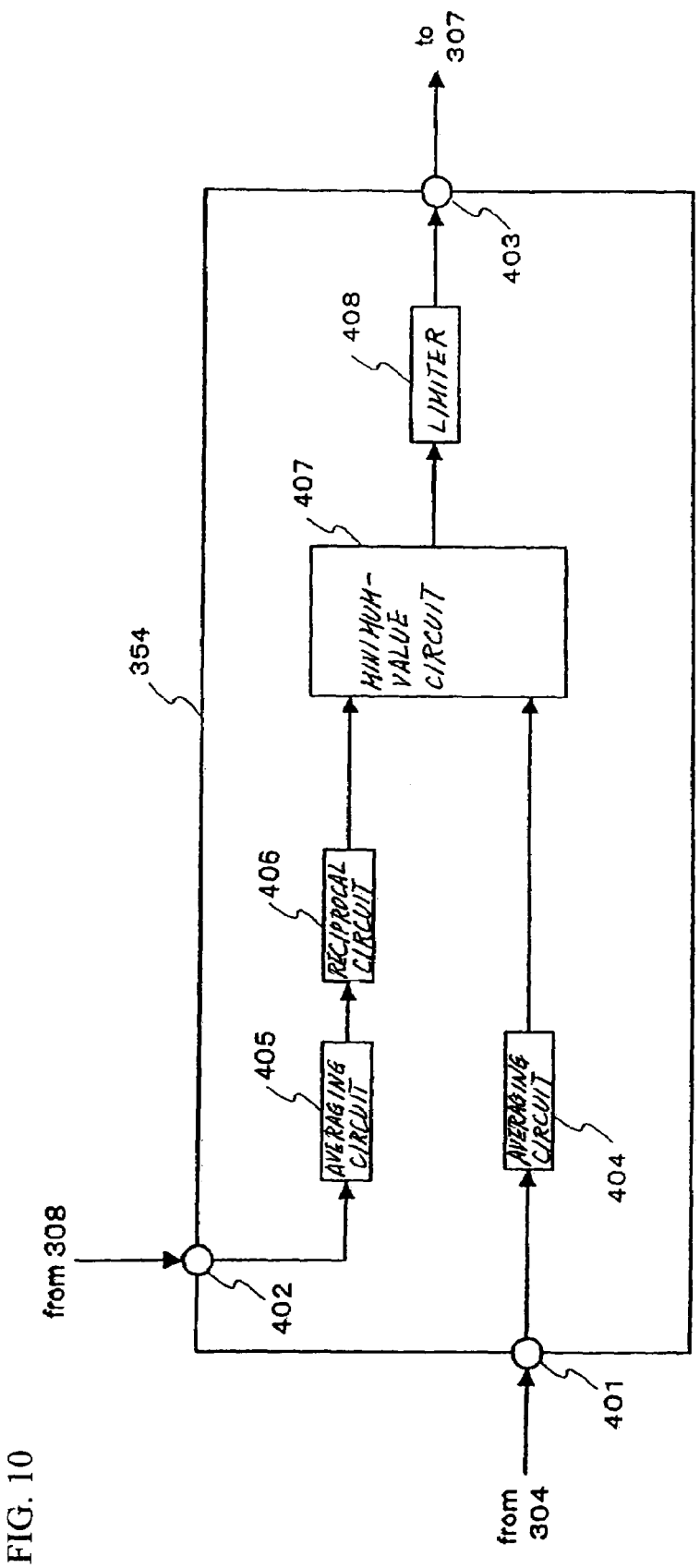
FIG. 10 is a block diagram showing an example of the configuration of the envelope target value generation circuit used in the adaptive digital filter of the third embodiment.

An example of the configuration of envelope target value generation circuit 354 is shown in FIG. 10.

As shown in FIG. 10, envelope target value generation circuit 354 is of a configuration that includes: averaging circuit 405 for finding the weighting average of signals of a past fixed time interval that are supplied from absolute value circuit 308 by way of input terminal 402; reciprocal circuit 406 for calculating the reciprocal of the value found in averaging circuit 405; averaging circuit 404 for finding the weighting average of signals of a past fixed time interval supplied from absolute value circuit 304 by way of input terminal 401; minimum-value circuit 407 for selecting the smaller value of the value supplied as output from reciprocal circuit 406 and the value supplied from averaging circuit 404; and limiter 408 for limiting the value selected by minimum-value circuit 407 to within an upper limit and lower limit that have been set in advance and supplying the result as the time-variable envelope target value by way of output terminal 403.

The reason for selecting the smaller value in minimum-value circuit 407 is that the smaller envelope target value further reduces the probability of the occurrence of overflow of filter coefficients. The configuration is otherwise the same as that of the first embodiment. Other than the operation of envelope target value generation circuit 354, the operations of the adaptive digital filter of the third embodiment are identical to those of the adaptive digital filter of the first embodiment.

Explanation next regards the effects of the adaptive digital filter of the third embodiment.

Envelope target value generation circuit 354 that is provided in the adaptive digital filter of the third embodiment generates an envelope target value that combines both the properties of the envelope target value generated by envelope target value generation circuit 305 of the first embodiment and the properties of the envelope target value generated by envelope target value generation circuit 352 of the second embodiment, whereby the probability of the occurrence of overflow of filter coefficients is reduced. As a result, the adaptive digital filter of the third embodiment does not necessitate higher accuracy of operations for the purpose of preventing overflow in operations in which the values of filter coefficients vary over a broad range, can decrease the amount operations, and can reduce the scale of hardware.

In addition, as in the first embodiment, coefficient update amount control unit 306 causes the coefficient update amount to decrease when the amplitude of the input signal that is supplied by way of input terminal 301 is too large, whereby the probability that filter coefficients will overflow is reduced. Still further, the amount of operations required for the convolution operation of the input signal and filter coefficients is reduced because the filter coefficients are real numbers and not complex amounts.

(Fourth Embodiment)

Figure 11:
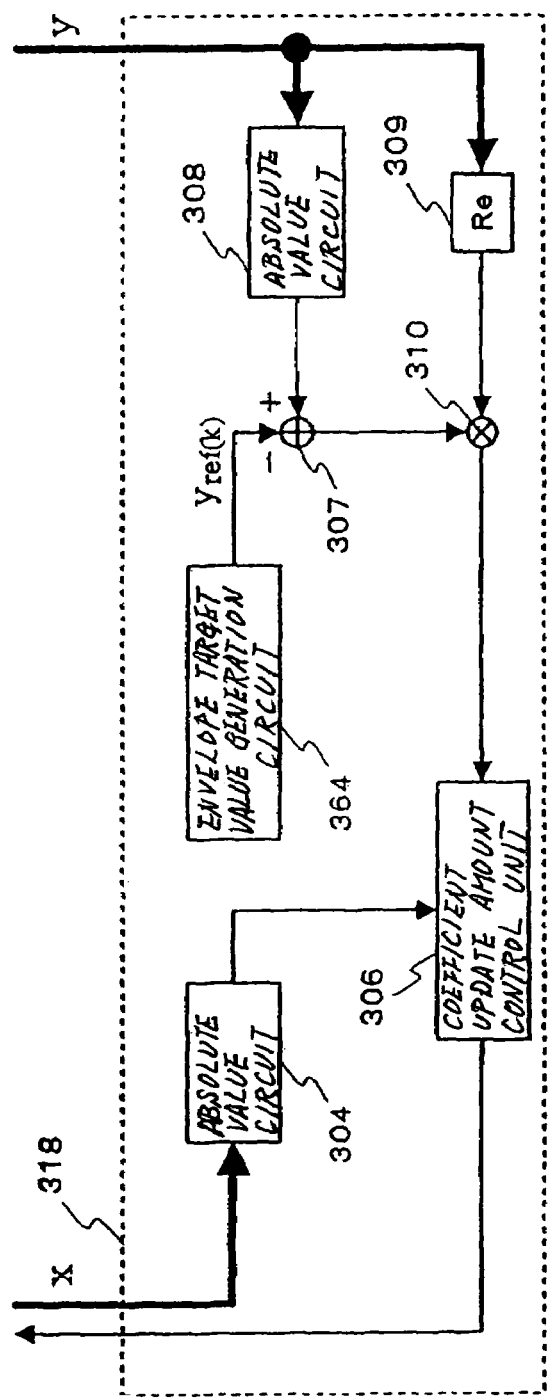
FIG. 11 is a block diagram showing the configuration of the principal elements of the fourth embodiment of the adaptive digital filter of the present invention.

As shown in FIG. 11, the adaptive digital filter of the fourth embodiment differs from the adaptive digital filter of the first embodiment in that a fixed envelope target value is generated. In other words, envelope target value generation circuit 364 provided in the adaptive digital filter of the fourth embodiment generates a fixed envelope target value regardless of the input and output signals of the adaptive digital filter. The configuration is otherwise identical to that of the first embodiment. In addition, with the exception of the operation of envelope target value generation circuit 364, the operations of the adaptive digital filter of the fourth embodiment are identical to those of the adaptive digital filter of the first embodiment.

According to the adaptive digital filter of the fourth embodiment, as in the first embodiment, coefficient update amount control unit 306 causes the coefficient update amount to decrease when the amplitude of the input signal supplied by way of input terminal 301 is too large, decreasing the probability that filter coefficients will overflow. Further, the amount of operations required for the convolution operations of the input signal and filter coefficients is reduced because the filter coefficients are real signals and not complex amounts.

(Fifth Embodiment)

Figure 12:
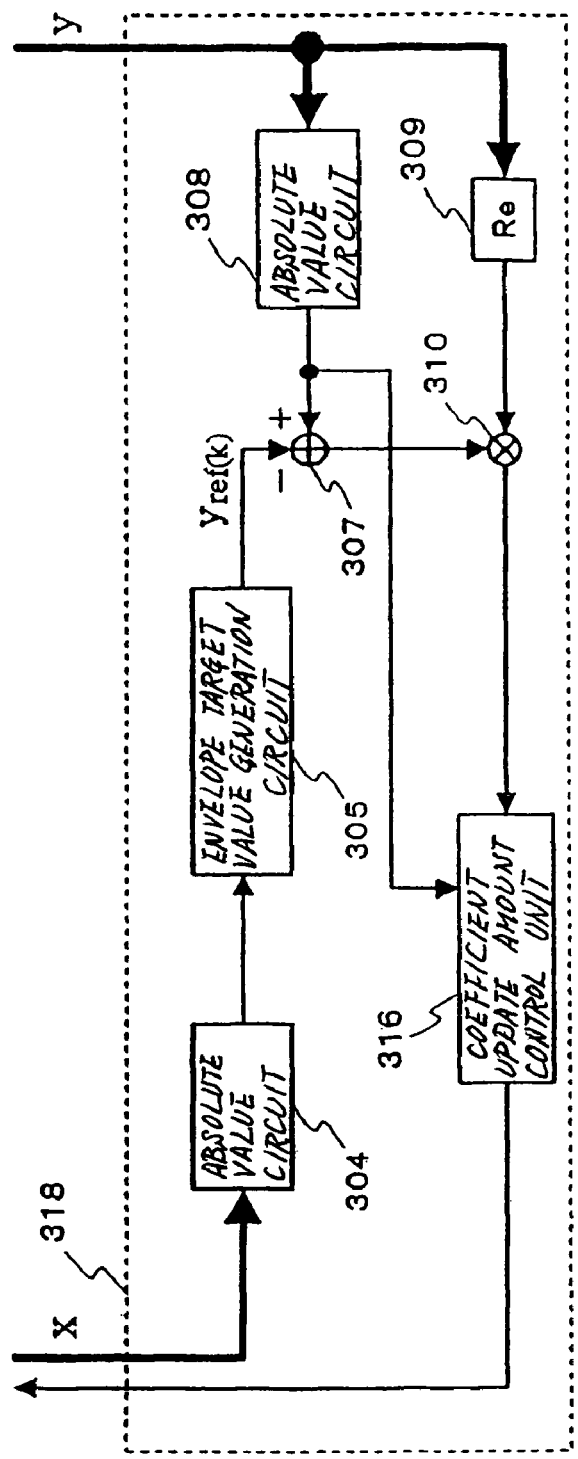
FIG. 12 is a block diagram showing the configuration of the principal elements of the fifth embodiment of the adaptive digital filter of the present invention.

As shown in FIG. 12, the adaptive digital filter of the fifth embodiment differs from the adaptive digital filter of the first embodiment in that the update amount of filter coefficients is controlled based on the output signal of the adaptive digital filter.

Figure 13:
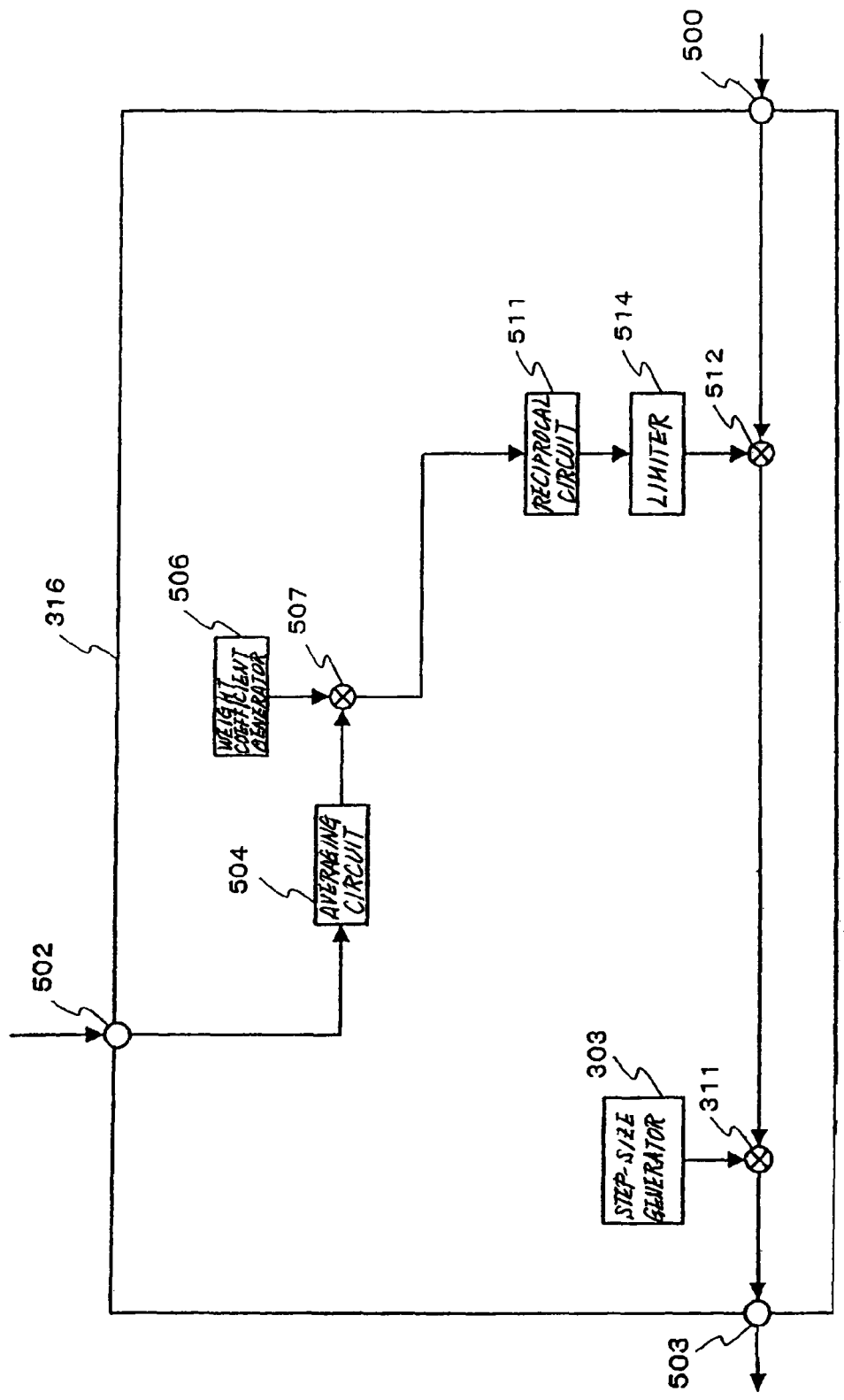
FIG. 13 is a block diagram showing an example of the configuration of the coefficient update amount control unit used in the adaptive digital filter of the fifth embodiment.

Coefficient update amount control unit 316 provided in the adaptive digital filter of the fifth embodiment has the function of reducing the coefficient update amount when the amplitude of the output signal of the adaptive digital filter is too large. FIG. 13 shows an example of the configuration of coefficient update amount control unit 316.

As shown in FIG. 13, the output signal of multiplier 310 shown in FIG. 12 is applied as input by way of input terminal 500 to multiplier 512. Multiplier 512 multiplies the signal received as input from input terminal 500 by the signal supplied from limiter 514 and supplies the result to multiplier 311.

Multiplier 311 multiplies the signal supplied from multiplier 512 by the value supplied from step-size generator 303 and supplies the result by way of output terminal 503 to separate units $319_0$-$319_{N-1}$ shown in FIG. 3.

The output signal of absolute value circuit 308 shown in FIG. 12 is applied by way of input terminal 502 to averaging circuit 504. Averaging circuit 504 calculates the time average of the signal received from input terminal 502 and supplies the result to multiplier 507 as the estimated value of the amplitude of the output signal.

Multiplier 507 multiplies the signal supplied from averaging circuit 504 by the value supplied from weight coefficient generator 506 and supplies the result to reciprocal circuit 511. Reciprocal circuit 511 calculates the reciprocal of the signal supplied from multiplier 507 and supplies the result to limiter 514. Limiter 514 effects control such that the value supplied from reciprocal circuit 511 falls between an upper limit and lower limit that have been set in advance and supplies the result to multiplier 512.

The configuration is otherwise identical to that of the first embodiment. The operations of the adaptive digital filter of the fifth embodiment are also identical to those of the adaptive digital filter of the first embodiment with the exception of the operation of coefficient update amount control unit 316.

Explanation next regards the effects of the present embodiment.

In coefficient update amount control unit 316 having the configuration shown in FIG. 13, the signal that is supplied to separate units $319_0$-$319_{N-1}$ from output terminal 503 is approximately proportional to the reciprocal of the estimated value of the amplitude of the signal received as input from input terminal 502. Accordingly, the signal becomes small when the amplitude of the output signal is too large. Typically, when the output signal of the adaptive digital filter is large, the input signal of the adaptive digital filter is also usually large. Thus, as in the first embodiment, the filter coefficients do not become large even when the input signal becomes extremely large, and the adaptive digital filter of the fifth embodiment therefore does not require highly accurate operations to prevent overflow in operations in which the values of the filter coefficients vary over a broad range, can decrease the amount of operations, and can reduce the scale of hardware.

Still further, due to the action of envelope target value generation circuit 305, as in the first embodiment, the filter coefficients do not become large values even when the level of the input signal is low, and the present embodiment therefore does not necessitate highly accurate operations to prevent overflow in operations in which the values of filter coefficients vary over a broad range, and can therefore both decrease the amount of operations and reduce the scale of hardware. The present embodiment also reduces the amount of operations required for the convolution operations of the input signal and filter coefficients because the filter coefficients are real signals and not complex amounts.

(Sixth Embodiment)

Figure 14:
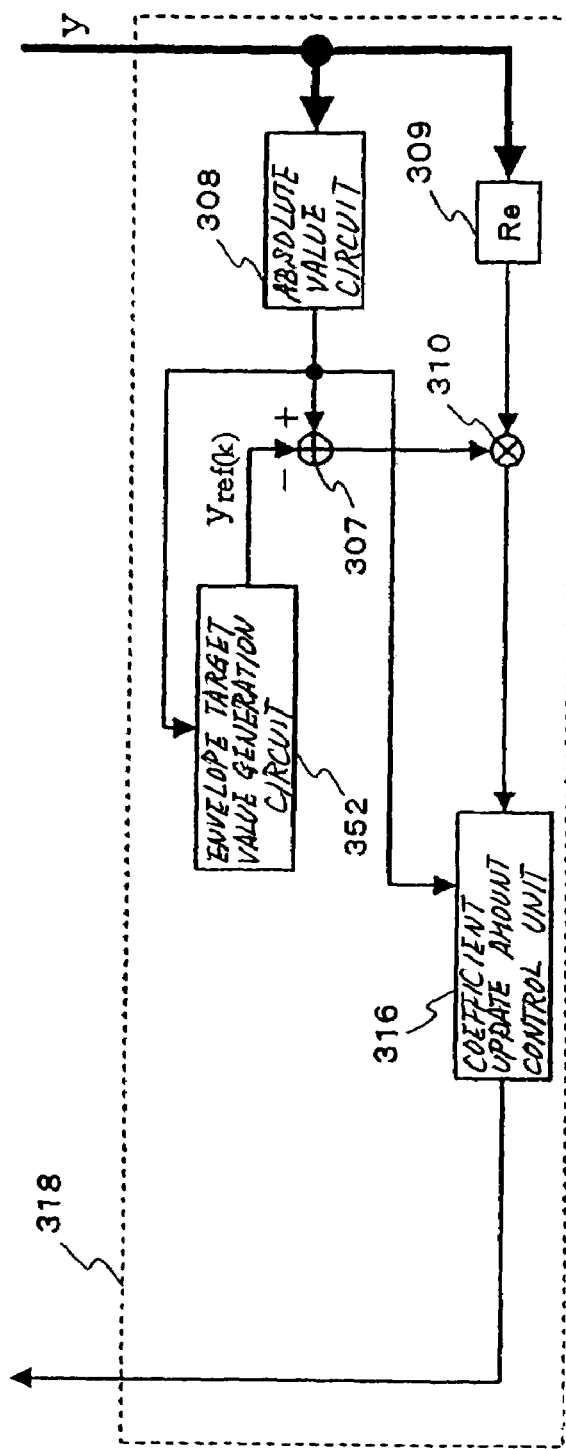
FIG. 14 is a block diagram showing the configuration of the principal elements of the sixth embodiment of the adaptive digital filter of the present invention.

As shown in FIG. 14, the adaptive digital filter of the sixth embodiment differs from the adaptive digital filter of the fifth embodiment in that the envelope target value is generated based on the output signal of the adaptive digital filter.

Envelope target value generation circuit 352 generates the envelope target value based on the value of the envelope (i.e., the amplitude value) of the output signal of the adaptive digital filter that is found in absolute value circuit 308. Envelope target value generation circuit 352 is provided with, for example, the configuration shown in FIG. 8, generates a small envelope target value when the amplitude of the output signal is large, and generates a large envelope target value when the amplitude of the output signal is small.

The configuration is otherwise identical to that of the fifth embodiment. The operations of the adaptive digital filter of the sixth embodiment are identical to those of the adaptive digital filter of the fifth embodiment with the exception of the operation of envelope target value generation circuit 352.

Explanation next regards the effects of the present embodiment.

The envelope target value generated by envelope target value generation circuit 352 provided in the adaptive digital filter of the sixth embodiment becomes small when the amplitude of the output signal supplied from the output terminal of the adaptive digital filter is large. When the output signal is large, the possibility increases that the values of the filter coefficients and internal signals in the filter unit are large. By decreasing the envelope target value, the values of the internal signals and filter coefficients change to the direction of decrease. In other words, the values of internal signals and filter coefficients fall within a fixed range. Because the values do not diverge from a fixed range, the probability of the occurrence of overflow in the filter coefficients and internal signals decreases.

As a result, as in the fifth embodiment, the adaptive digital filter of the sixth embodiment does not require highly accurate operations to prevent overflow in operations in which the values of filter coefficients vary over a broad range and therefore can decrease the amount of operations and reduce the hardware scale.

As in the fifth embodiment, coefficient update amount control unit 316 reduces the coefficient update amount when the amplitude of the input signal supplied by way of input terminal 301 is too large, whereby the probability that the filter coefficients will overflow is reduced. The present embodiment further reduces the amount of operations required for the convolution operations of the input signal and filter coefficients because the filter coefficients are real signals and not complex amounts.

(Seventh Embodiment)

Figure 15:
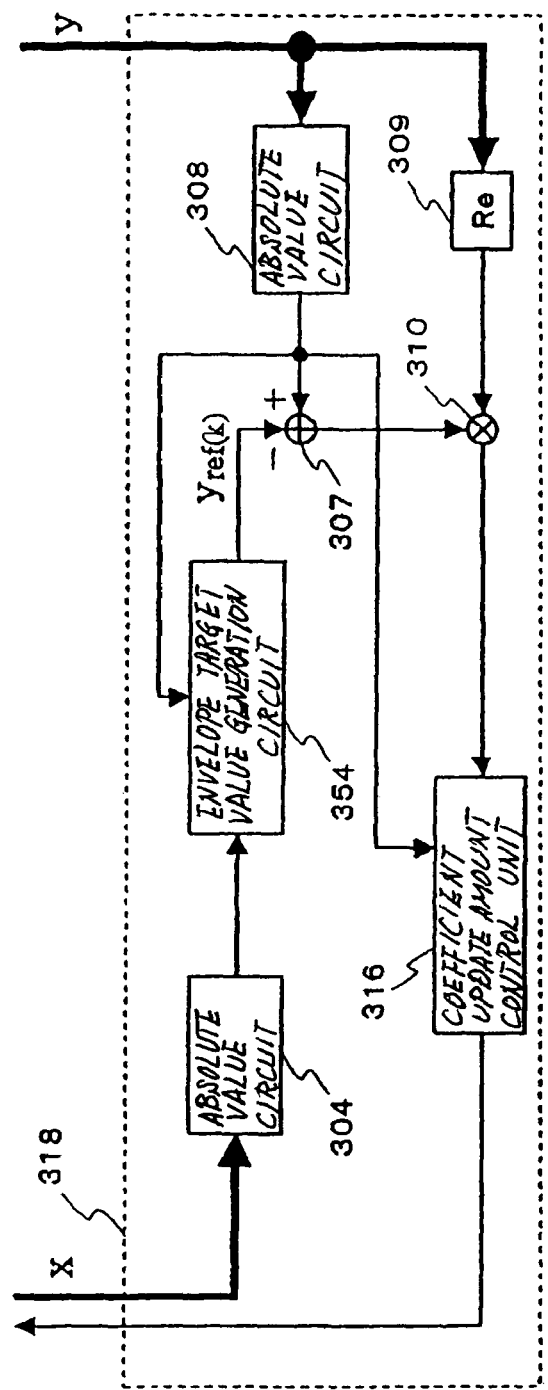
FIG. 15 is a block diagram showing the configuration of the principal elements of the seventh embodiment of the adaptive digital filter of the present invention.

As shown in FIG. 15, the adaptive digital filter of the seventh embodiment differs from the adaptive digital filter of the fifth embodiment in that the envelope target value is generated based on both the input signal and output signal of the adaptive digital filter.

Envelope target value generation circuit 354 that is provided in the adaptive digital filter of the seventh embodiment generates the envelope target value based on the envelope value (amplitude value) of the input signal of the adaptive digital filter that is found in absolute value circuit 304 and the envelope value (amplitude value) of the output signal of the adaptive digital filter that is found in absolute value circuit 308 and supplies the envelope target value as output to subtractor 307. Envelope target value generation circuit 354 is provided with, for example, the configuration shown in FIG. 10, and generates a small envelope target value when the amplitude of the input signal is small and generates a large envelope target value when the amplitude of the input signal is large. Envelope target value generation circuit 354 further generates a small envelope target value when the amplitude of the output signal is large and generates a large envelope target value when the amplitude of the output signal is small.

The configuration is otherwise identical to that of the fifth embodiment. In addition, the operations of the adaptive digital filter of the seventh embodiment are identical to those of the adaptive digital filter of the fifth embodiment with the exception of the operation of envelope target value generation circuit 354.

Explanation next regards the effects of the present embodiment.

Envelope target value generation circuit 354 that is provided in the adaptive digital filter of the seventh embodiment generates an envelope target value that combines both the properties of the envelope target value generated by envelope target value generation circuit 305 of the fifth embodiment and the properties of the envelope target value generated by envelope target value generation circuit 352 of the sixth embodiment, whereby the probability that filter coefficients will overflow is further reduced. Thus, as with the fifth embodiment, the adaptive digital filter of the seventh embodiment does not require higher accuracy operations to prevent overflow in operations in which the values of filter coefficients vary over a broad range, can decrease the amount of operations, and can reduce the scale of hardware.

Further, as with the fifth embodiment, the coefficient update amount is reduced by coefficient update amount control unit 316 when the amplitude of the input signal supplied by way of input terminal 301 is too large, whereby the probability that filter coefficients will overflow is reduced. The amount of operations required for the convolution operations of the input signal and filter coefficients is further reduced because the filter coefficients are real signals and not complex amounts.

(Eighth Embodiment)

Figure 16:
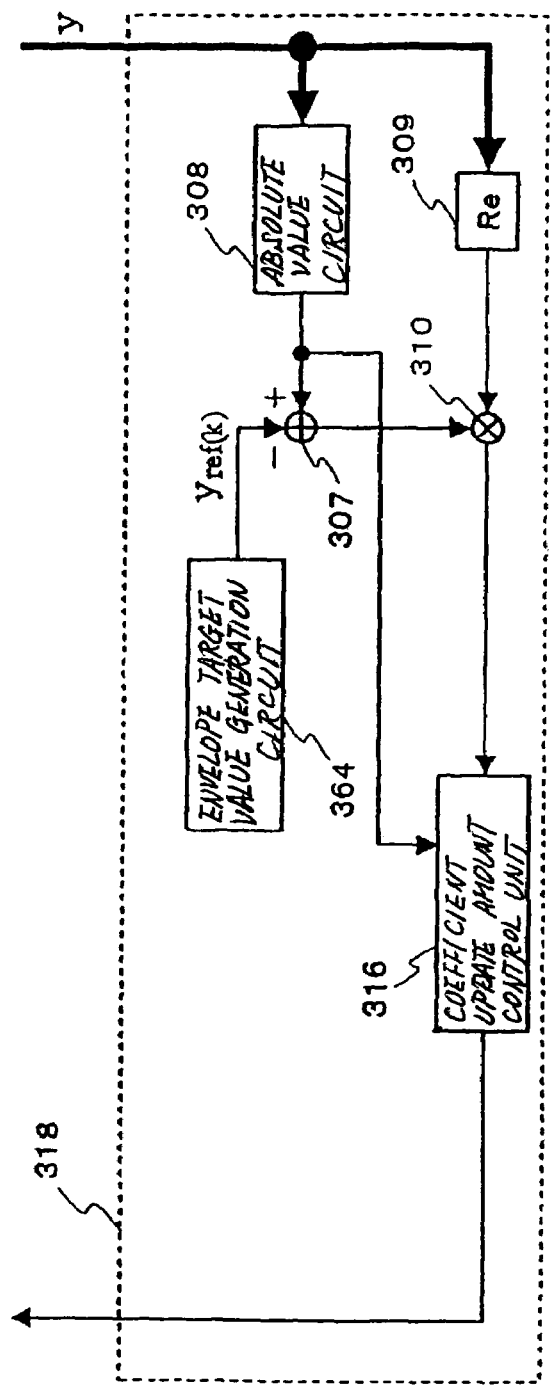
FIG. 16 is a block diagram showing the configuration of the principal elements of the eighth embodiment of the adaptive digital filter of the present invention.

As shown in FIG. 16, the adaptive digital filter of the eighth embodiment differs from the adaptive digital filter of the fifth embodiment in that a fixed envelope target value is generated. In other words, envelope target value generation circuit 364 generates a fixed envelope target value regardless of the input or output signal of the adaptive digital filter. The configuration is otherwise identical to that of the fifth embodiment, and the operations of the adaptive digital filter of the eighth embodiment are identical to those of the adaptive digital filter of the fifth embodiment with the exception of the operation of envelope target value generation circuit 364.

As in the fifth embodiment, according to the adaptive digital filter of the eighth embodiment, coefficient update amount control unit 316 causes the coefficient update amount to decrease when the amplitude of the input signal supplied by way of input terminal 301 is too large, whereby the probability that filter coefficients will overflow is reduced. Further, the amount of operations required for the convolution operations of the input signal and filter coefficients is reduced because the filter coefficients are real signals and not complex amounts.

(Ninth Embodiment)

Figure 17:
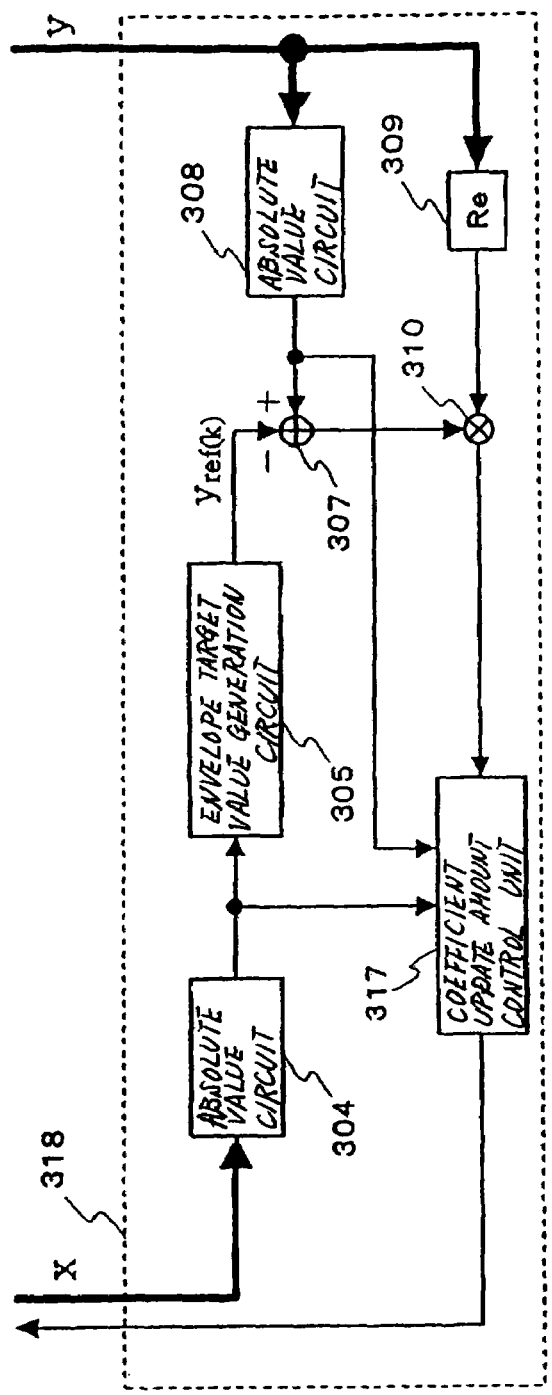
FIG. 17 is a block diagram showing the configuration of the principal elements of the ninth embodiment of the adaptive digital filter of the present invention.

As shown in FIG. 17, the adaptive digital filter of the ninth embodiment differs from the adaptive digital filter of the first embodiment in that the update amount of filter coefficients is controlled based on both the input signal and output signal of the adaptive digital filter.

Coefficient update amount control unit 317 provided in adaptive digital filter of the ninth embodiment has the function of reducing the coefficient update amount when the amplitude of the input signal of the adaptive digital filter is too large and when the amplitude of the output signal of the adaptive digital filter is too large.

Figure 18:
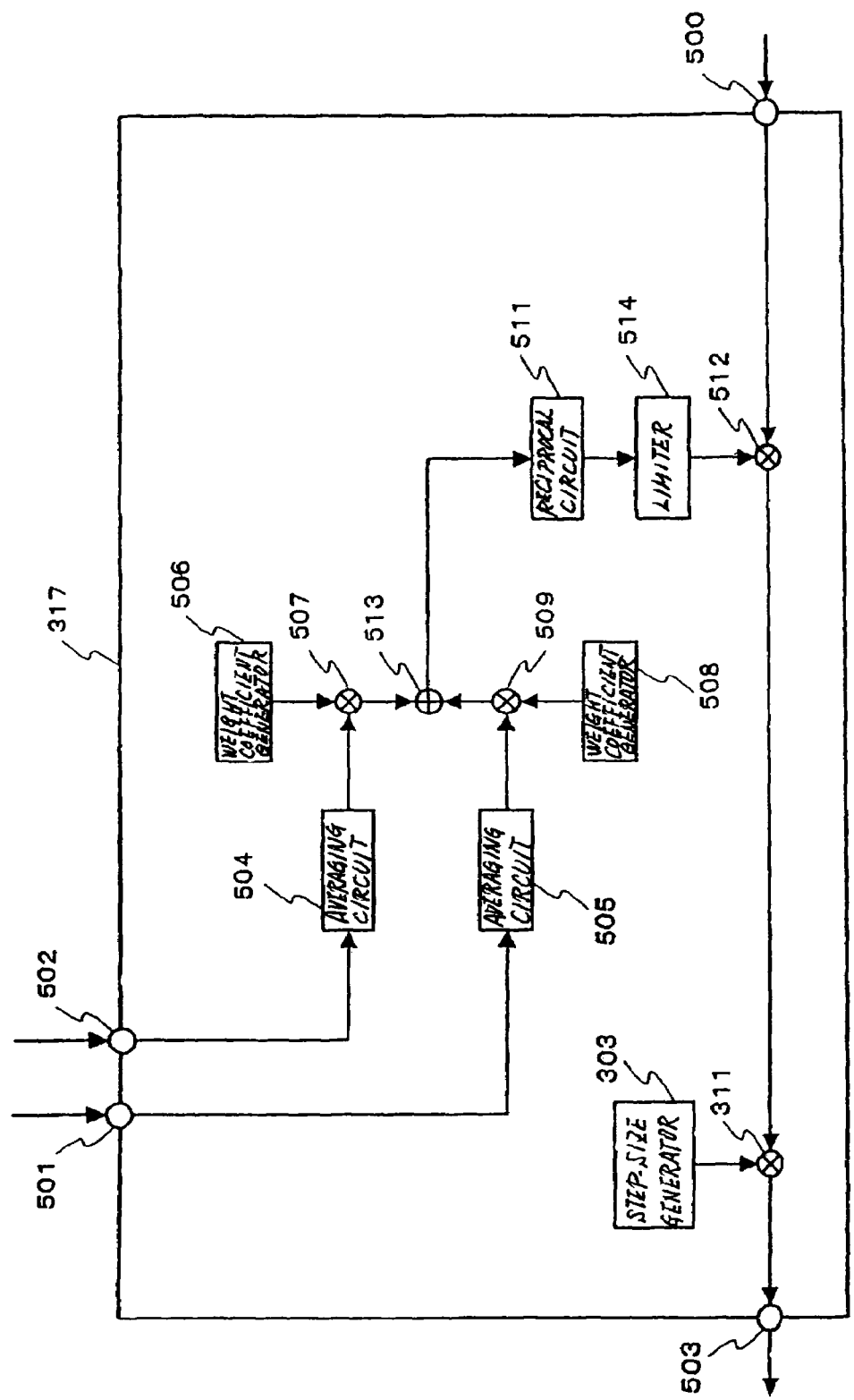
FIG. 18 is a block diagram showing an example of the configuration of the coefficient update amount control unit used in the adaptive digital filter of the ninth embodiment.

FIG. 18 shows an example of the configuration of coefficient update amount control unit 317.

As shown in FIG. 18, the output signal of multiplier 310 shown in FIG. 17 is applied as input to multiplier 512 by way of input terminal 500. Multiplier 512 multiplies the signal received as input from input terminal 500 by the signal supplied from limiter 514 and supplies the result to multiplier 311. Multiplier 311 multiplies the signal supplied from multiplier 512 by the value supplied from step-size generator 303 and supplies the result to output terminal 503. Signals are supplied as output from output terminal 503 to separate units $319_0$-$319_{N-1}$ shown in FIG. 3.

The signal supplied as output from absolute value circuit 304 shown in FIG. 17 is applied by way of input terminal 501 to averaging circuit 505. Averaging circuit 505 calculates the time average of the signal received as input from input terminal 501 and supplies the result to multiplier 509 as the estimated value of the amplitude of the input signal. Multiplier 509 multiplies the signal supplied from averaging circuit 505 by the value supplied from weight coefficient generator 508 and supplies the result to adder 513. The signal supplied as output from absolute value circuit 308 shown in FIG. 17 is further applied by way of input terminal 502 to averaging circuit 504. Averaging circuit 504 calculates the time average of the signal received from input terminal 502 and supplies the result to multiplier 507 as the estimated value of the amplitude of the output signal.

Multiplier 507 multiplies the signal supplied from averaging circuit 504 by the value supplied from weight coefficient generator 506 and supplies the result to adder 513. Adder 513 adds the signals supplied from multiplier 509 and multiplier 507 and supplies the result to reciprocal circuit 511. Reciprocal circuit 511 calculates the reciprocal of the signal supplied from adder 513 and supplies the result to limiter 514. Limiter 514 limits the value supplied from reciprocal circuit 511 to between an upper limit and lower limit that have been set in advance and supplies this result to multiplier 512.

Figure 19:
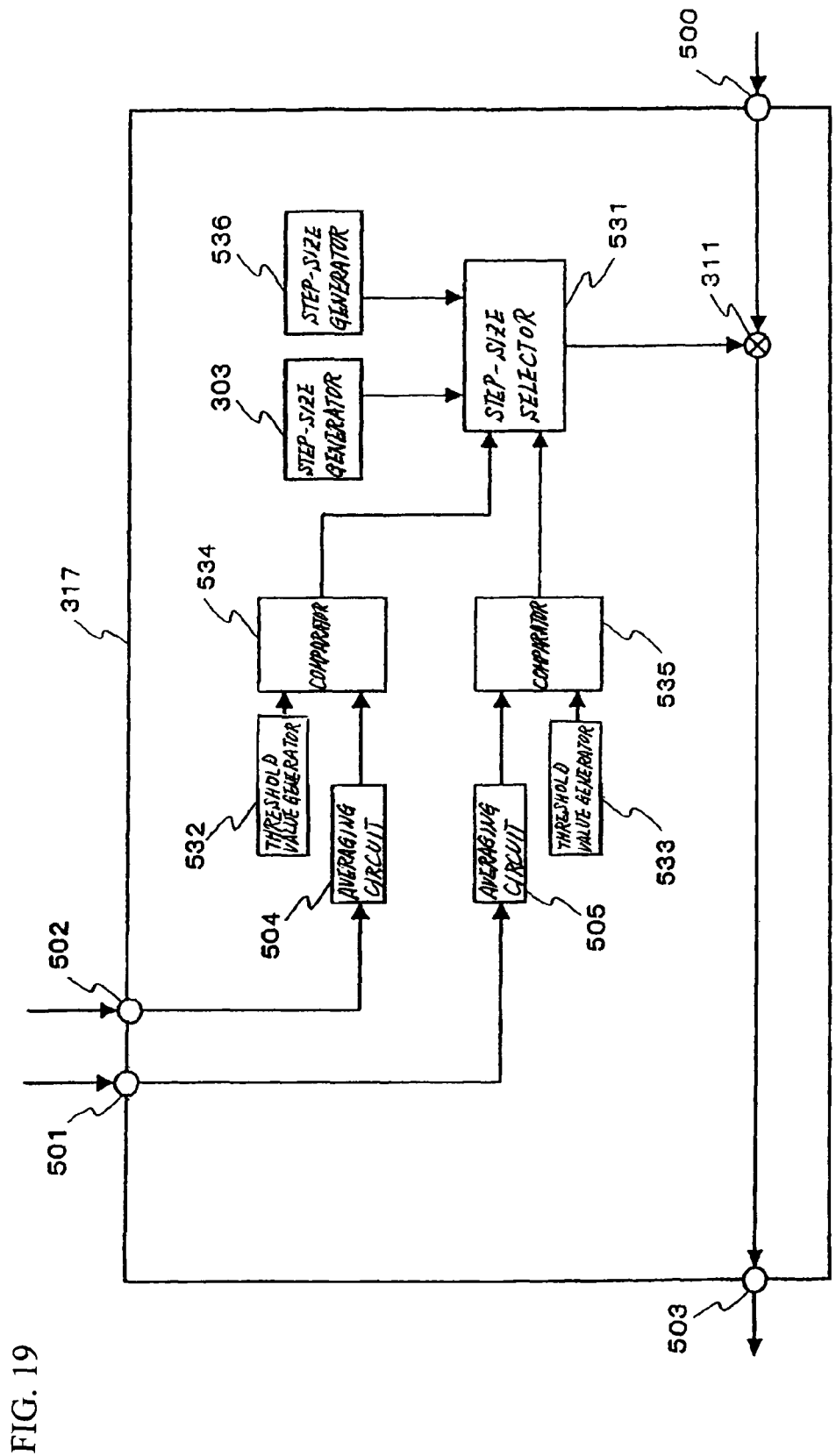
FIG. 19 is a block diagram showing another example of the configuration of the coefficient update amount control unit used in the adaptive digital filter of the ninth embodiment.

FIG. 19 shows another example of the configuration of coefficient update amount control unit 317 that is provided in the adaptive digital filter of the ninth embodiment.

As shown in FIG. 19, the output signal of multiplier 310 shown in FIG. 17 is applied as input to multiplier 311 by way of input terminal 500. Multiplier 311 multiplies the signal received from input terminal 500 by the signal supplied from step-size selector 531 and supplies the result to output terminal 503. The signal is supplied from output terminal 503 to each of separate units $319_0$-$319_{N-1}$ shown in FIG. 3.

The signal supplied as output from absolute value circuit 304 shown in FIG. 17 is applied by way of input terminal 501 to averaging circuit 505. Averaging circuit 505 calculates the time average of the signal received from input terminal 501 and supplies the result to comparator 535 as the estimated value of the amplitude of the input signal. Comparator 535 compares the signal supplied from averaging circuit 505 with a threshold value supplied from threshold value generator 533 and supplies "1" as output when the signal supplied from averaging circuit 505 is greater than the threshold value and otherwise supplies "0" as output. In addition, the signal supplied as output from absolute value circuit 308 shown in FIG. 17 is applied by way of input terminal 502 to averaging circuit 504. Averaging circuit 504 calculates the time average of the signal received from input terminal 502 and supplies the result to comparator 534 as the estimated value of the amplitude of the output signal. Comparator 534 compares the signal supplied from averaging circuit 504 with the threshold value supplied from threshold value generator 532 and supplies "1" as output when the signal supplied from averaging circuit 504 is greater than the threshold value and otherwise supplies "0" as output. Step-size generator 303 and step-size generator 536 each generate different step sizes and supply the step sizes to step-size selector 531. In this case, the step size generated by step-size generator 536 is smaller than the step size generated by step-size generator 303. Step-size selector 531 selects either one of the different step sizes supplied from step-size generator 303 and step-size generator 536 based on the value supplied from comparator 534 and comparator 535 and supplies the selected step size to multiplier 311.

When the value supplied from comparator 534 is "1" or when the value supplied from comparator 535 is "1," step-size selector 531 supplies the smaller step size supplied from step-size generator 536 to multiplier 311, and otherwise supplies the step size supplied from step-size generator 303 to multiplier 311.

Figure 20:
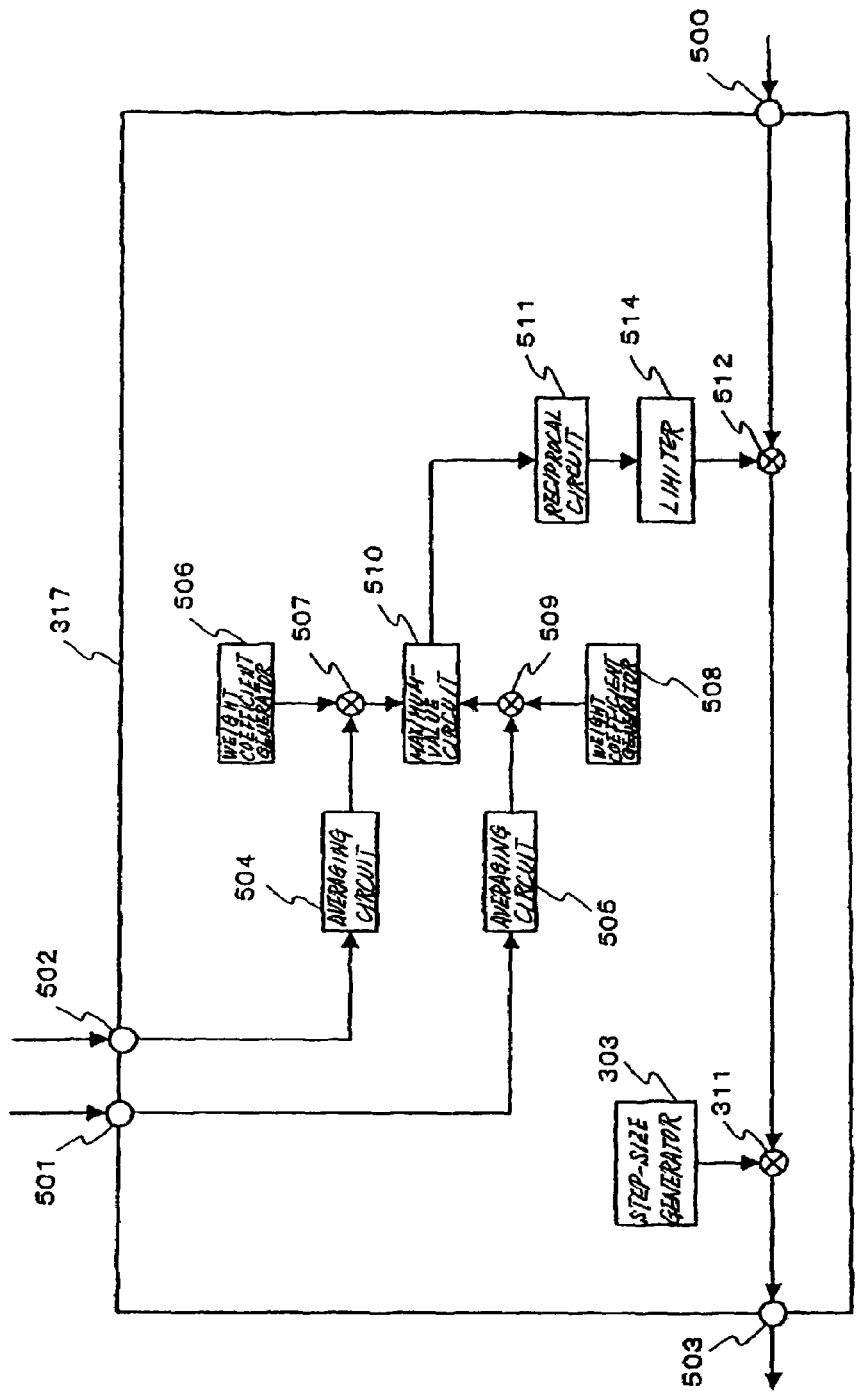
FIG. 20 is a block diagram showing another example of the configuration of the coefficient update amount control unit used in the adaptive digital filter of the ninth embodiment.

FIG. 20 shows yet another example of the configuration of coefficient update amount control unit 317 provided in the adaptive digital filter of the ninth embodiment.

Coefficient update amount control unit 317 shown in FIG. 20 is a configuration in which adder 513 of coefficient update amount control unit 317 shown in FIG. 18 is replaced by maximum-value circuit 510.

Of the signal supplied from multiplier 507 and the signal supplied from multiplier 509, maximum-value circuit 510 selects the signal having the larger value and supplies this value to reciprocal circuit 511. The coefficient update amount can thus be decreased when either of the input signal or output signal of the adaptive digital filter is too large.

Coefficient update amount control unit 317 is not limited to the configurations shown by way of example in FIGS. 18-20, the configuration being open to variation as long as the coefficient update amount for the estimated value of the amplitude of at least one of the input signal and output signal of the adaptive digital filter is, in a broad sense, subjected to monotonic decrease.

The configuration is otherwise identical to that of the first embodiment. In addition, the operations of the adaptive digital filter of the ninth embodiment are identical to those of the adaptive digital filter of the first embodiment with the exception of the operation of coefficient update amount control unit 317.

Explanation next regards the effects of the ninth embodiment.

In coefficient update amount control unit 317 having the configuration shown in FIG. 18, FIG. 19, or FIG. 20, the signal supplied from output terminal 503 to separate units $319_0$-$319_{N-1}$ is made smaller when the estimated value of the amplitude of the input signal that is supplied by way of input terminal 501 is too large or when the estimated value of the amplitude of the output signal supplied by way of input terminal 502 is too large. Typically, when the output signal of the adaptive digital filter is large, the input signal of the adaptive digital filter is usually also large. As in the first embodiment, the filter coefficients do not become large values even when the input signal is extremely large, and the adaptive digital filter of the ninth embodiment therefore does not require higher accuracy of operations to prevent overflow in operations in which the values of the filter coefficients vary over a broad range and can therefore decrease the amount of operations and reduce the scale of hardware.

In addition, as in the first embodiment, the action of envelope target value generation circuit 305 prevents filter coefficients from becoming large values even when the level of the input signal is low, whereby higher accuracy is not required to prevent overflow in operations in which the values of filter coefficients vary over a broad range, whereby the amount of operations can be decreased and the scale of hardware can be reduced. Still further, the amount of operations required for the convolution operations of the input signal and filter coefficients can be reduced because the filter coefficients are real signals and not complex amounts.

(Tenth Embodiment)

Figure 21:
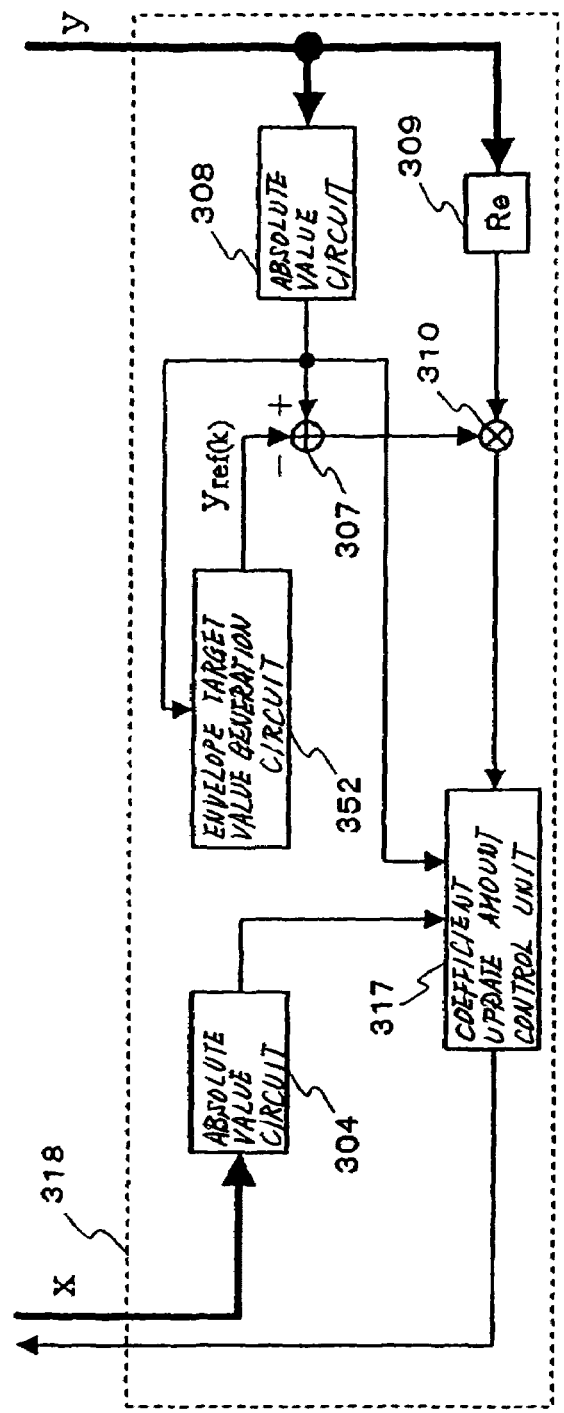
FIG. 21 is a block diagram showing the configuration of the principal elements of the tenth embodiment of the adaptive digital filter of the present invention.

As shown in FIG. 21, the adaptive digital filter of the tenth embodiment differs from the adaptive digital filter of the ninth embodiment in that the envelope target value is generated based on the output signal of the adaptive digital filter.

Envelope target value generation circuit 352 provided in the adaptive digital filter of the tenth embodiment generates an envelope target value based on the envelope value (i.e., the amplitude value) of the output signal of the adaptive digital filter that is found in absolute value circuit 308 and supplies this envelope target value to subtractor 307. Envelope target value generation circuit 352 is provided with, for example, the configuration shown in FIG. 8, generates a small envelope target value when the amplitude of the output signal is large, and generates a large envelope target value when the amplitude of the output signal is small.

The configuration is otherwise identical to that of the ninth embodiment. In addition, the operations of the adaptive digital filter of the tenth embodiment are identical to those of the adaptive digital filter of the ninth embodiment with the exception of the operation of envelope target value generation circuit 352.

Explanation next regards the effect of the present embodiment.

The envelope target value generated by envelope target value generation circuit 352 provided in the adaptive digital filter of the tenth embodiment decreases when the amplitude of the output signal of the adaptive digital filter is large. Increase of the output signal raises the possibility that the values of internal signals and filter coefficients will also increase. Decreasing the envelope target value changes the values of internal signals and filter coefficients to a downward trend. In other words, the values of internal signals and filter coefficients fall within a fixed range. If the signals do not diverge from a fixed range, the probability that overflow will occur in the internal signals and filter coefficients decreases. Accordingly, the adaptive digital filter of the tenth embodiment, as with the ninth embodiment, does not require higher accuracy to prevent overflow in operations in which the values of filter coefficients vary over a broad range and can therefore decrease the amount of operations and reduce the scale of hardware.

As with the ninth embodiment, coefficient update amount control unit 317 causes the coefficient update amount to decrease when the amplitude of the input signal supplied by way of input terminal 301 is too large and decreases the probability that filter coefficients will overflow. Still further, the amount of operations required for the convolution operations of the input signal and filter coefficients is decreased because the filter coefficients are real signals and not complex amounts.

(Eleventh Embodiment)

Figure 22:
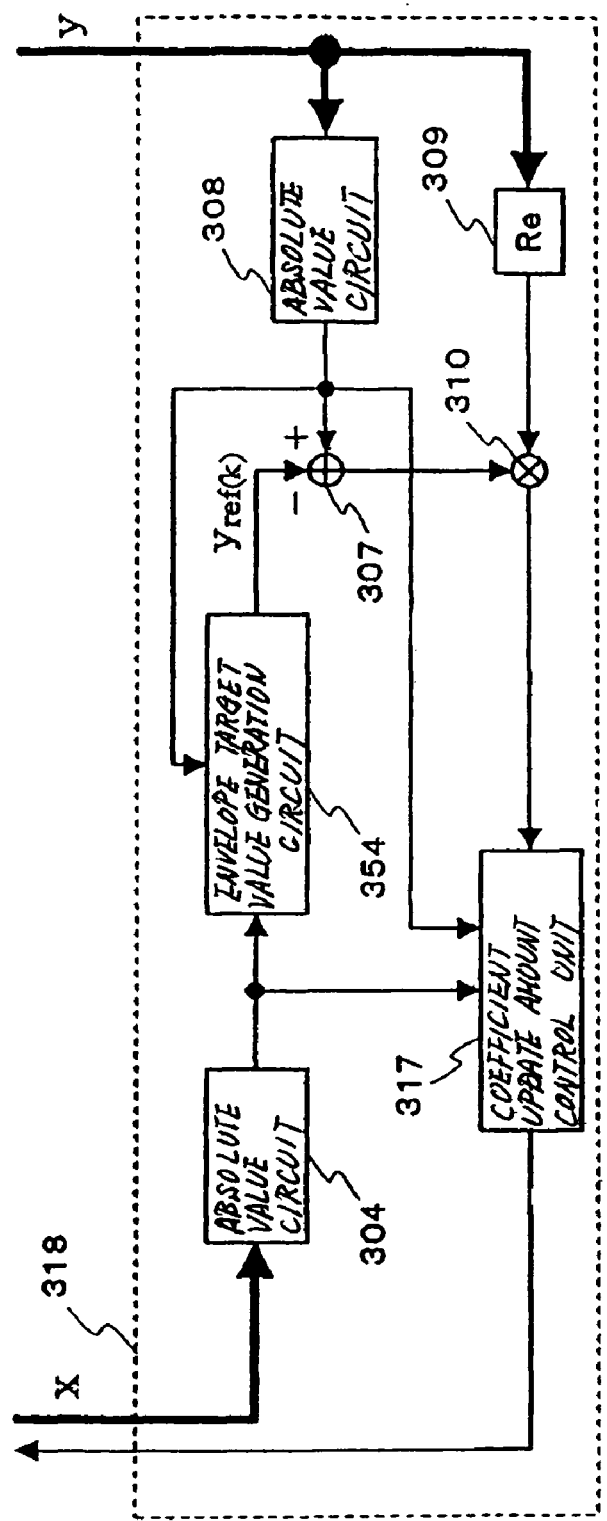
FIG. 22 is a block diagram showing the configuration of the principal elements of the eleventh embodiment of the adaptive digital filter of the present invention.

As shown, in FIG. 22, the adaptive digital filter of the eleventh embodiment differs from the adaptive digital filter of the ninth embodiment in that the envelope target value is generated based on both the input signal and output signal of the adaptive digital filter.

Envelope target value generation circuit 354 provided in the adaptive digital filter of the eleventh embodiment generates the envelope target value based on both the envelope value (amplitude value) of the input signal of the adaptive digital filter that is found in absolute value circuit 304 and the envelope value (amplitude value) of the output signal of the adaptive digital filter that is found in absolute value circuit 308 and supplies the envelope target value to subtractor 307.

Envelope target value generation circuit 354 is provided with, for example, the configuration shown in FIG. 10, generates a small envelope target value when the amplitude of the input signal is small, and generates a large envelope target value when the amplitude of the input signal is large. Envelope target value generation circuit 354 further generates a small envelope target value when the amplitude of the output signal is large and generates a large envelope target value when the amplitude of the output signal is small.

The configuration is otherwise identical to that of the ninth embodiment. In addition, the operations of the adaptive digital filter of the eleventh embodiment are identical to those of the adaptive digital filter of the ninth embodiment with the exception of the operation of envelope target value generation circuit 354.

Explanation next regards the effect of the present embodiment.

Envelope target value generation circuit 354 provided in the adaptive digital filter of the eleventh embodiment generates an envelope target value combines both the properties of the envelope target value generated by envelope target value generation circuit 305 of the ninth embodiment and the properties of the envelope target value generated by envelope target value generation circuit 352 of the tenth embodiment, whereby the probability that filter coefficients will overflow is reduced. Accordingly, as in the ninth embodiment, the adaptive digital filter of the eleventh embodiment does not require higher accuracy of operations to prevent overflow in which the values of filter coefficients vary over a broad range, can decrease the amount of operations, and can reduce the scale of hardware.

As in the ninth embodiment, coefficient update amount control unit 317 causes the coefficient update amount to decrease when the amplitude of the input signal supplied by way of input terminal 301 is too large, and thus reduced the probability that filter coefficients will overflow. Further, the amount of operations required for the convolution operations of the input signal and filter coefficients is reduced because the filter coefficients are real signals and not complex amounts.

(Twelfth Embodiment)

Figure 23:
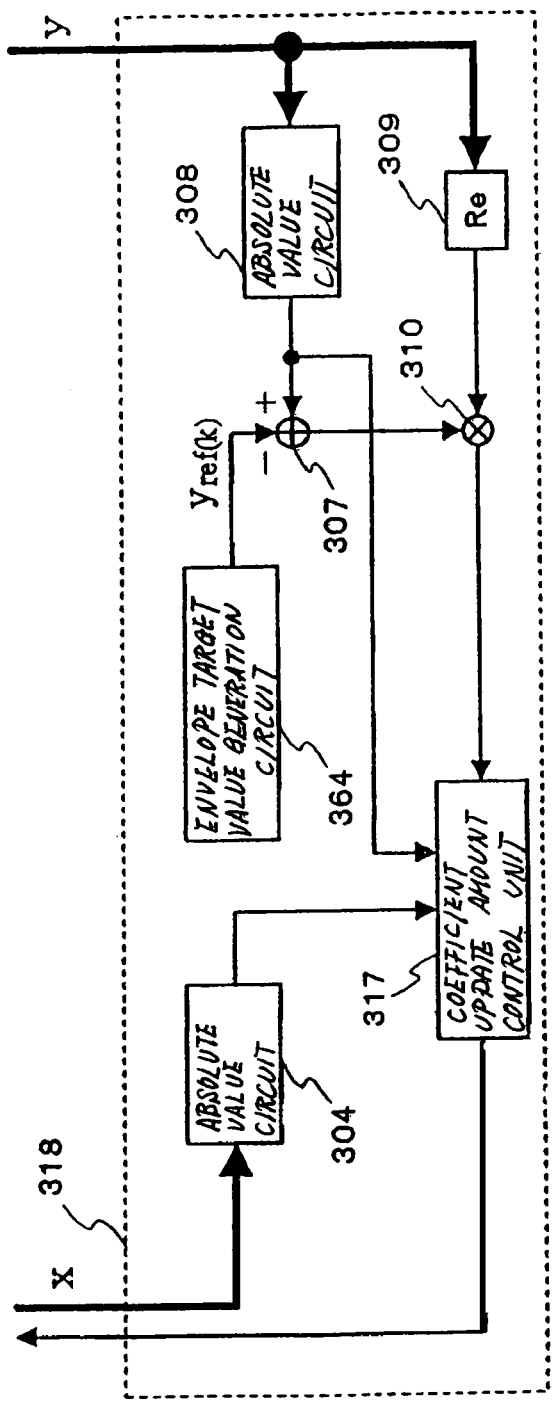
FIG. 23 is a block diagram showing the configuration of the principal elements of the twelfth embodiment of the adaptive digital filter of the present invention.

As shown in FIG. 23, the adaptive digital filter of the twelfth embodiment differs from the adaptive digital filter of the ninth embodiment in that a fixed envelope target value is generated. In other words, envelope target value generation circuit 364 provided in adaptive digital filter of the twelfth embodiment generates a fixed envelope target value regardless of the input/output signals of the adaptive digital filter. The configuration is otherwise identical to that of the ninth embodiment. In addition, the operations of the adaptive digital filter of the twelfth embodiment are identical to those of the adaptive digital filter of the ninth embodiment with the exception of the operation of envelope target value generation circuit 364.

In the adaptive digital filter of the twelfth embodiment, as in the ninth embodiment, coefficient update amount control unit 317 causes the coefficient update amount to decrease when the amplitude of the input signal supplied by way of input terminal 301 is too large, whereby the probability that filter coefficients will overflow decreases. The amount of operations required for the convolution operations of the input signal and filter coefficients is further decreased because the filter coefficients are real signals and not complex amounts.

(Thirteenth Embodiment)

Figure 24:
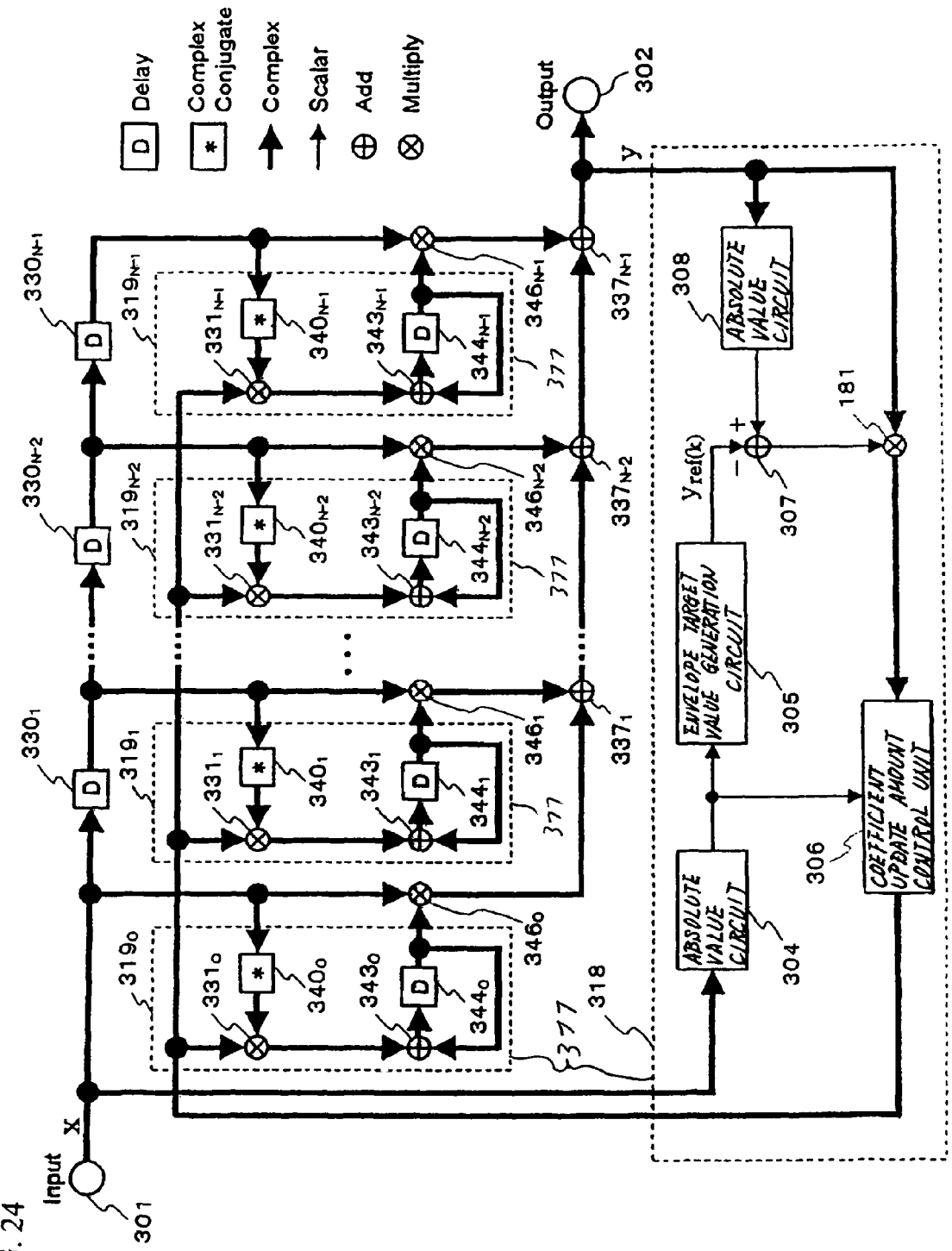
FIG. 24 is a block diagram showing the configuration of the thirteenth embodiment of the adaptive digital filter of the present invention.

As shown in FIG. 24, the adaptive digital filter of the thirteenth embodiment is of a configuration that includes: a filter unit for generating an output signal that is a complex signal (complex output signal) by means of convolution operations of a complex signal (complex input signal) received from input terminal 301 and filter coefficients that are complex signals (complex filter coefficients) and supplying the result from output terminal 302; and a coefficient control unit 377 for controlling filter coefficients based on error between a target signal and an index value derived from the complex output signal (the value of the envelope in the present embodiment). Block 318 shown in FIG. 25 and N blocks $319_0$-$319_{N-1}$ make up the coefficient control unit 377, and the remaining parts make up the filter unit. In this case, the complex input signal is a complex signal in which one of two signals that are generated from one real signal and that have phases that differ from each other by 90° is a real part and the other signal is an imaginary part.

The filter unit is an FIR (Finite Impulse Response) filter in which the tap number is N, i.e., in which the number of filter coefficients is N, and is of a configuration that includes: a tapped delay line composed of N−1 delay units $330_1$-$330_{N-1}$ for each causing a delay of one sampling cycle, N multipliers $346_0$-$346_{N-1}$ for multiplying the complex input signal and the output signals of delay units $330_1$-$330_{N-1}$ by the filter coefficients, and N−1 adders $337_1$-$337_{N-1}$ for successively adding the multiplication results of these N multipliers $346_0$-$346_{N-1}$.

The coefficient control unit uses as an adaptive algorithm a complex LMS that has been expanded to allow handling of complex numbers, and is provided with common unit 318 that is common to the control of all filter coefficients and separate units $319_0$-$319_{N-1}$ for controlling each of the filter coefficients.

Common unit 318 is of a configuration that includes: absolute value circuit 304 for calculating the value of the envelope (i.e., the amplitude value) of the complex input signal by means of the square sum of the real part and imaginary part and supplying the result as output; envelope target value generation circuit 305 for generating an envelope target value based on the amplitude value of an input signal supplied from this absolute value circuit 304; absolute value circuit 308 for calculating the value of the envelope of the complex output signal by means of the square sum of the real part and imaginary part and supplying the result as output; subtractor 307 for supplying a value obtained by subtracting the envelope target value from the value of the envelope found in absolute value circuit 308; multiplier 181 for supplying the result obtained by multiplying the output of subtractor 307 and the complex output signal; and coefficient update amount control unit 306 for calculating a coefficient update amount based on the output of this multiplier 181 and the amplitude value of the input signal supplied from absolute value circuit 304 and supplying the result to separate units $319_0$-$319_{N-1}$.

Separate units $319_0$-$319_{N-1}$ are provided with: complex conjugators $340_0$-$340_{N-1}$ for receiving the complex input signal or the output signals of corresponding delay units $330_1$-$330_{N-1}$ on the tapped delay line, subjecting these complex signals to complex conjugation transformation, and supplying the result as output; multipliers $331_0$-$331_{N-1}$ for multiplying the signal received from common unit 318 with the complex signals supplied from complex conjugators $340_0$-$340_{N-1}$; adders $343_0$-$343_{N-1}$ for adding the filter coefficients conferred to multipliers $346_0$-$346_{N-1}$ and the outputs of multipliers $331_0$-$331_{N-1}$ and supplying the results as filter coefficients to be used in the next sampling cycle; and delay units $344_0$-$344_{N-1}$ for delaying by one sampling-cycle the output of adders $343_0$-$343_{N-1}$ and supplying the results to multipliers $346_0$-$346_{N-1}$.

Coefficient update amount control unit 306 is provided with the configuration shown in FIG. 4 similar to the first embodiment. In the case of the present embodiment, however, the signal received as input from input terminal 500 is a complex signal, and multiplier 512 and multiplier 311 therefore multiply the complex signal and a real signal and supply a complex signal as the result of multiplication.

Similar to the first embodiment, envelope target value generation circuit 305 is provided with the configuration shown in FIG. 5, generates a small envelope target value when the amplitude of the input signal is small, and generates a large envelope target value when the amplitude of the input signal is large.

The algorithm of the adaptive digital filter of the present embodiment is expressed as follows:

$$W(k+1)=W(k)-\mu\gamma(|y(k)|p-yref(k))qy(k)X^H(k) \quad (13)$$

$$y(k)=W^T(k)X(k) \quad (14)$$

$$W(k)=[w0(k), w1(k), \ldots, wN-1(k)]^T \quad (15)$$

$$X(k)=[x(k), x(k-1), \ldots, x(k-N+1)]^T \quad (16)$$

$$yref(k)=Av[|x(k)|] \quad (17)$$

$$Av[|x(k)|]=(1-\beta)Av[|x(k-1)|]+\beta|x(k)| \quad (18)$$

where W(k) is a filter coefficient vector, X(k) is a complex signal vector, k is a sample index, N is the filter tap number, y(k) is the output signal, yref is the time-variable envelope target value, $\mu$ is a parameter for determining the update amount of filter coefficients, Av[ ] represents the operation of averaging, $\beta$ is a weighting coefficient and is a positive constant that satisfies the relation 0<$\beta$<1, and $\gamma$ is a parameter that is substantially proportional to the reciprocal of the amplitude of the input signal and corresponds to the output of limiter 514 of FIG. 4. In addition, H represents a complex conjugate transposition and T represents a transposition. The values p and q are constants for determining an evaluation function of the error with respect to the envelope target value, the values of p and q being, for example, p=1 and q=1.

Explanation next regards the operations of the adaptive digital filter of the thirteenth embodiment.

The adaptive digital filter of the thirteenth embodiment, as with the first embodiment, repeatedly executes adaptive equalizing process S2 and parameter updating process S4 shown in FIG. 6 with each input of a new complex input signal to input terminal 301. Adaptive equalizing process S2 is a process based on the above-mentioned Equation (14), and parameter updating process S4 is a process based on the above-mentioned Equation (13). Details of each operation are explained hereinbelow.

Explanation first regards adaptive equalizing process S2.

The complex input signal received from input terminal 301 is both supplied to multiplier $346_0$ and complex conjugator $340_0$ and supplied to the tapped delay line composed of delay units $330_1$-$330_{N-1}$ for bringing about a delay of one sampling cycle. The complex signal supplied to delay units $330_1$-$330_{N-1}$ is transmitted to the adjacent delay unit for each clock and the output signals of delay units $330_1$-$330_{N-1}$ are supplied to corresponding multipliers $346_1$-$346_{N-1}$ and corresponding complex conjugators $340_1$-$340_{N-1}$.

Multiplier $346_0$ multiplies the complex signal received as input from input terminal 301 by the complex filter coefficient supplied from delay unit $344_0$ and supplies the result to adder $337_1$. Multipliers $346_1$-$346_{N-1}$ multiply the complex signals supplied from corresponding delay units $330_1$-$330_{N-1}$ by the complex filter coefficients supplied from corresponding delay units $344_1$-$344_{N-1}$ and supply the results to adders $337_1$-$337_{N-1}$.

Adders $337_1$-$337_{N-1}$ add all complex signals that have been supplied from multipliers $346_0$-$346_{N-1}$ and both supply the results to output terminal 302 and to absolute value circuit 308 and multiplier 181. In this way, an output signal that is a complex signal is generated by a convolution operation of the complex input signal and filter coefficients that are complex signals.

Explanation next regards parameter updating process S4.

Absolute value circuit 304 calculates the amplitude value of the complex input signal and supplies the result to envelope target value generation circuit 305 and coefficient update amount control unit 306. Envelope target value generation circuit 305 generates an envelope target value that is substantially proportional to the input signal and supplies the result to subtractor 307.

Absolute value circuit 308 calculates the absolute value of the complex output signal that is received as input and supplies the result as the envelope target value to subtractor 307. Subtractor 307 subtracts the envelope value supplied from envelope target value generation circuit 305 from the signal supplied from absolute value circuit 308 and supplies the result to multiplier 181. Multiplier 181 multiplies the signal supplied from subtractor 307 by the complex output signal and supplies the result to coefficient update amount control unit 306.

Multiplier 512 of coefficient update amount control unit 306 multiplies the signal supplied from multiplier 181 by the signal supplied from limiter 514 shown in FIG. 4 and supplies the result to multiplier 311. The signal here supplied from limiter 514 is, due to averaging circuit 505, multiplier 509, and reciprocal circuit 511, substantially the reciprocal of the estimated value of the amplitude of the input signal of the adaptive digital filter. Multiplier 311 multiplies the signal supplied from multiplier 512 and the step size generated at step-size generator 303 and supplies the result to separate units $319_0$-$319_{N-1}$.

Separate units $319_0$-$319_{N-1}$ supply the signal supplied from coefficient update amount control unit 306 to multipliers $331_0$-$331_{N-1}$. Complex conjugators $340_0$-$340_{N-1}$ subject the complex input signal supplied from input terminal 301 or corresponding delay units $330_1$-$330_{N-1}$ to complex conjugation transformation and supply the results to corresponding multipliers $331_0$-$331_{N-1}$. Multipliers $331_0$-$331_{N-1}$ multiply the real-number signals supplied from corresponding complex conjugators $340_0$-$340_{N-1}$ and the complex signal supplied from common unit 318 and supply the result to corresponding adders $343_0$-$343_{N-1}$.

Adders $343_0$-$343_{N-1}$ add the complex signals supplied from corresponding multipliers $331_0$-$331_{N-1}$ to the complex filter coefficients supplied from corresponding delay units $344_0$-$344_{N-1}$ and supply the results to corresponding delay units $344_0$-$344_{N-1}$ as the filter coefficients of the next sampling. Delay units $344_0$-$344_{N-1}$ delay the complex filter coefficients supplied from corresponding adders $343_0$-$343_{N-1}$ by exactly one sampling cycle and both supply the results to corresponding multipliers $346_0$-$346_{N-1}$ and to corresponding adders $343_0$-$343_{N-1}$.

Explanation next regards the effects of the present embodiment.

The signal supplied from coefficient update amount control unit 306 to separate units $319_0$-$319_{N-1}$ is proportional to the reciprocal of the estimated value of the amplitude of the input signal supplied by way of input terminal 301. In other words, the signal becomes small when the amplitude of the input signal supplied by way of input terminal 301 is too large. Separate units $319_0$-$319_{N-1}$ find by means of multipliers $331_0$-$331_{N-1}$ the coefficient update amounts by carrying out multiplication that takes as multiplicands each of the signal supplied from coefficient update amount control unit 306 and the complex conjugation transformation value of the input signal, and as a result, even when the input signal, which is one of the multiplicands, is too large, the signal supplied from coefficient update amount control unit 306, which is the other multiplicand, becomes small. The resulting coefficient update amount is therefore small and the probability that filter coefficients will overflow is reduced. Accordingly, filter coefficients do not become large values even when the input signal is extremely large, thus eliminating the need for higher accuracy of operations to prevent overflow in operations in which the values of filter coefficients vary over a broad range, thus enabling a decrease in the amount of operations and enabling a reduction of the scale of hardware.

In addition, the time-variable envelope target value generated in envelope target value generation circuit 305 is substantially proportional to the amplitude of the input signal supplied by way of input terminal 301, and the filter coefficients therefore do not become large values even when the input signal level is low, as in the first embodiment. As a result, there is no need for higher accuracy to prevent overflow in operations in which the values of filter coefficients vary over a broad range, the amount of operations can be decreased, and the scale of hardware can be reduced.

(Fourteenth Embodiment)

Figure 25:
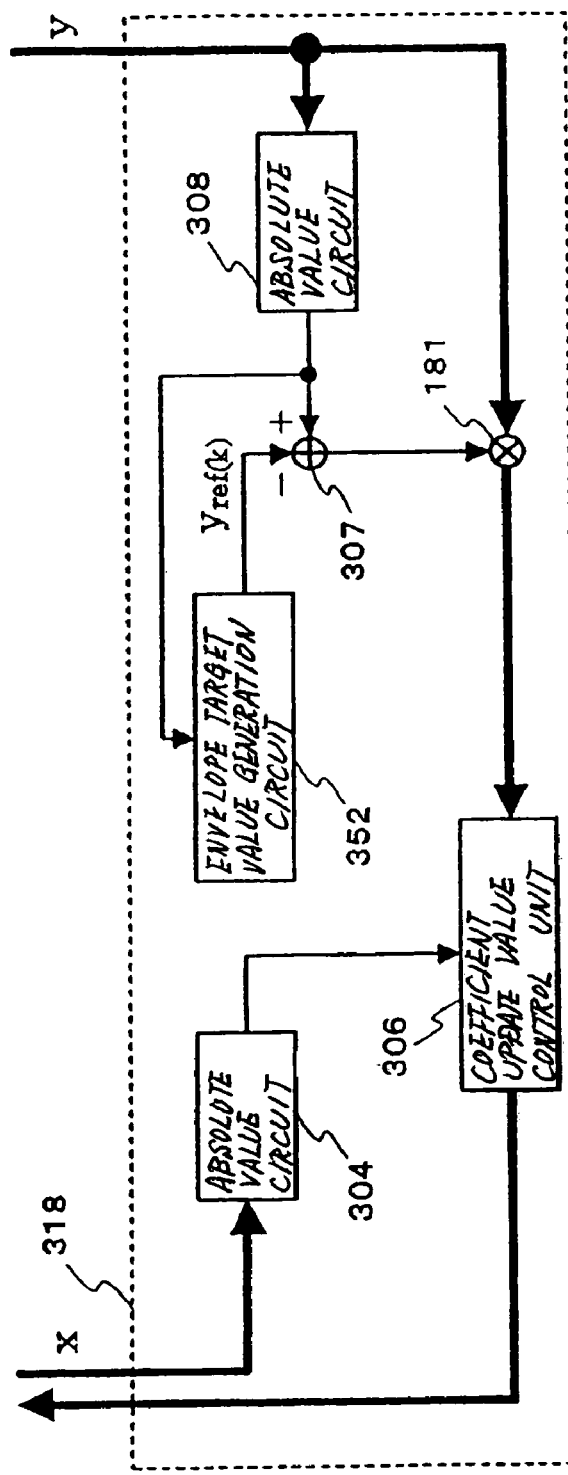
FIG. 25 is a block diagram showing the configuration of the principal elements of the fourteenth embodiment of the adaptive digital filter of the present invention.

As shown in FIG. 25, the adaptive digital filter of the fourteenth embodiment differs from the adaptive digital filter of the thirteenth embodiment in that the envelope target value is generated based on the output signal of the adaptive digital filter.

As with the second embodiment, envelope target value generation circuit 352 provided in the adaptive digital filter of the fourteenth embodiment is provided with the configuration shown in FIG. 8, generates a small envelope target value when the amplitude of the output signal is large, and generates a large envelope target value when the amplitude of the output signal is small.

The configuration is otherwise identical to that of the thirteenth embodiment. In addition, the operations of the adaptive digital filter of the fourteenth embodiment are identical to those of the adaptive digital filter of the thirteenth embodiment with the exception of the operation of envelope target value generation circuit 352.

Explanation next regards the effects of the present embodiment.

The envelope target value generated by envelope target value generation circuit 352 becomes small when the amplitude of the output signal supplied from the output terminal of the adaptive digital filter is large. When the output signal is large, the possibility increases that the values of, for example, the internal signals or the filter coefficients in the filter unit will be large. By decreasing the envelope target value as in the present invention, the values of the internal signals or filter coefficients can be changed to the direction of decrease. In other words, the values of the internal signals and filter coefficients can be kept within a fixed range. Keeping these values within a fixed range means that the probability of overflow of the filter coefficients or internal signals is reduced. Accordingly, as in the thirteenth embodiment, there is no need for higher accuracy to prevent overflow in operations in which the values of filter coefficients vary over a broad range, whereby the amount of operations can be decreased and the scale of hardware can be reduced.

(Fifteenth Embodiment)

Figure 26:
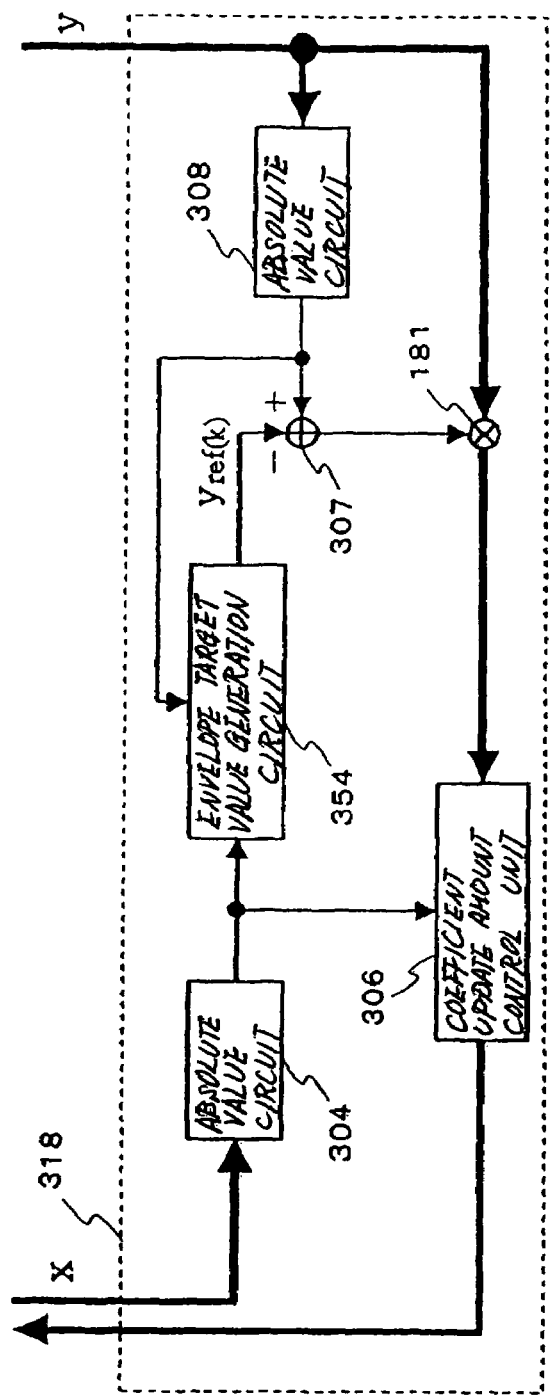
FIG. 26 is a block diagram showing the configuration of the principal elements of the fifteenth embodiment of the adaptive digital filter of the present invention.

As shown in FIG. 26, the adaptive digital filter of the fifteenth embodiment differs from the adaptive digital filter of the thirteenth embodiment in that the envelope target value is generated based on both the input signal and output signal of the adaptive digital filter.

Envelope target value generation circuit 354 that is provided in the adaptive digital filter of the fifteenth embodiment generates an envelope target value based on the value of the envelope (the amplitude value) of the input signal of the adaptive digital filter that is found in absolute value circuit 304 and the value of the envelope (the amplitude value) of the output signal of the adaptive digital filter that is found in absolute value circuit 308 and supplies the result to subtractor 307. As with the third embodiment, envelope target value generation circuit 354 is provided with the configuration shown in FIG. 10, generates a small envelope target value when the amplitude of the input signal is small, and generates a large envelope target value when the amplitude of the input signal is large. In addition, envelope target value generation circuit 354 generates a small envelope target value when the amplitude of the output signal is large and generates a large envelope target value when the amplitude of the output signal is small.

The configuration is otherwise identical to that of the thirteenth embodiment. In addition, the operations of the adaptive digital filter of the fifteenth embodiment are identical to those of the adaptive digital filter of the thirteenth embodiment with the exception of the operation of envelope target value generation circuit 354.

Explanation next regards the effects of the present embodiment.

Envelope target value generation circuit 354 that is provided in the adaptive digital filter of the fifteenth embodiment generates an envelope target value that combines both the properties of the envelope target value generated by envelope target value generation circuit 305 of the thirteenth embodiment and the properties of the envelope target value generated by envelope target value generation circuit 352 of the fourteenth embodiment. As a result, the probability of the occurrence of overflow is reduced. Thus, as in the thirteenth embodiment, there is no need for higher accuracy to prevent overflow in operations in which values of filter coefficients vary over a broad range, whereby the amount of operations can be decreased and the scale of hardware can be reduced.

(Sixteenth Embodiment)

Figure 27:
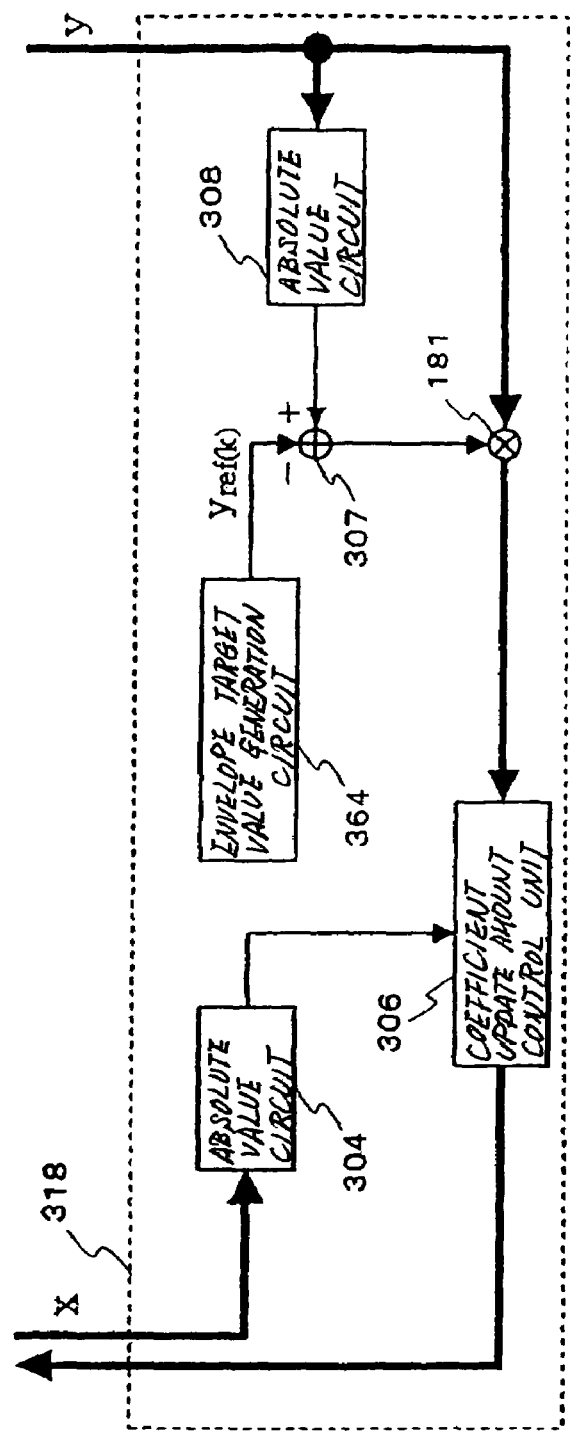
FIG. 27 is a block diagram showing the configuration of the principal elements of the sixteenth embodiment of the adaptive digital filter of the present invention.

As shown in FIG. 27, the adaptive digital filter of the sixteenth embodiment differs from the adaptive digital filter of the thirteenth embodiment in that a fixed envelope target value is generated. In other words, envelope target value generation circuit 364 that is provided in the adaptive digital filter of the sixteenth embodiment generates a fixed envelope target value regardless of the input/output signals of the adaptive digital filter. The configuration is otherwise identical to that of the thirteenth embodiment. In addition, the operations of the adaptive digital filter of the sixteenth embodiment are identical to those of the adaptive digital filter of the thirteenth embodiment with the exception of the operation of envelope target value generation circuit 364.

According to the present embodiment, as in the thirteenth embodiment, coefficient update amount control unit 306 causes the coefficient update amount to decrease when the amplitude of the input signal supplied by way of input terminal 301 is too large, reducing the probability that filter coefficients will overflow. In addition, the amount of operations required for the convolution operations of the input signal and filter coefficients is reduced because the filter coefficients are real signals and not complex amounts.

(Seventeenth Embodiment)

Figure 28:
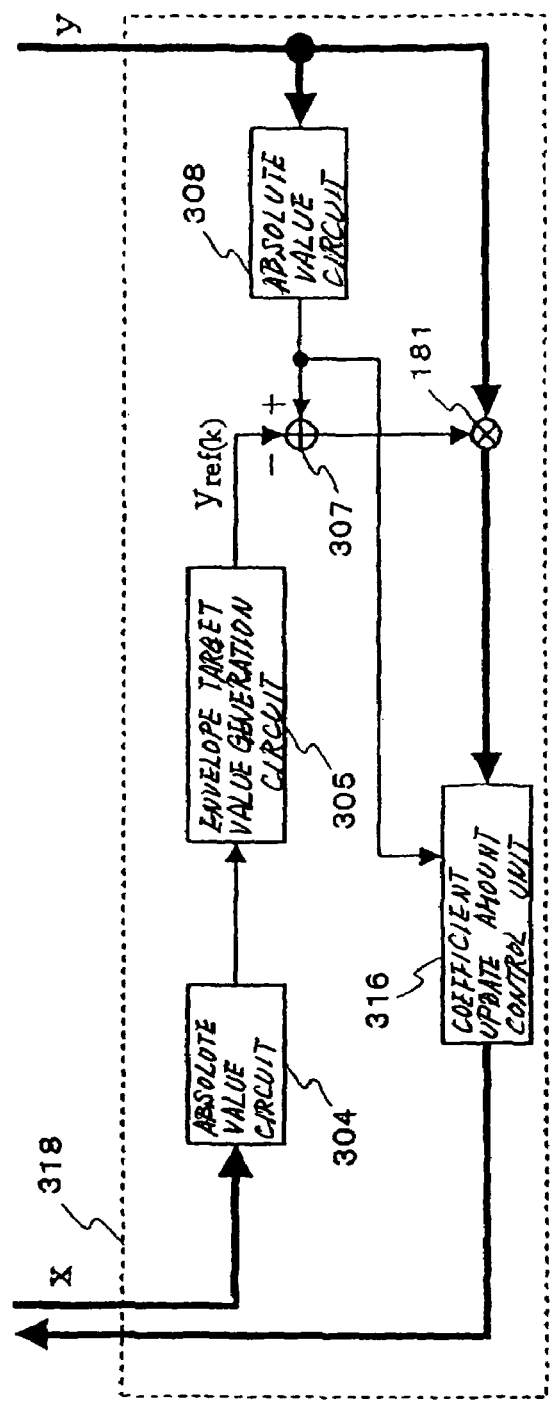
FIG. 28 is a block diagram showing the configuration of the principal elements of the seventeenth embodiment of the adaptive digital filter of the present invention.

As shown in FIG. 28, the adaptive digital filter of the seventeenth embodiment differs from the adaptive digital filter of the thirteenth embodiment in that the update amounts of filter coefficients are controlled based on the output signal of the adaptive digital filter.

Coefficient update amount control unit 316 that is provided in the adaptive digital filter of the seventeenth embodiment is provided with the configuration shown in FIG. 13 and is provided with the function to decrease coefficient update amounts when the amplitude of the output signal of the adaptive digital filter is too large. The configuration is otherwise identical to that of the thirteenth embodiment. In addition, the operations of the adaptive digital filter of the seventeenth embodiment are identical to those of the adaptive digital filter of the thirteenth embodiment with the exception of the operation of coefficient update amount control unit 316.

Explanation next regards the effects of the present embodiment.

In coefficient update amount control unit 316 provided with the configuration shown in FIG. 13, the signal supplied to separate units $319_0$-$319_{N-1}$ from output terminal 503 is approximately proportional to the reciprocal of the estimated value of the amplitude of the signal received from input terminal 502. Accordingly, the signal decreases if the amplitude of the output signal supplied by way of input terminal 502 is too large. Typically, if the output signal of the adaptive digital filter is large, the input signal of the adaptive digital filter is usually also large. Thus, as with the thirteenth embodiment, the filter coefficients do not become large values even when the input signal is an extremely large value, and the adaptive digital filter of the seventeenth embodiment eliminates the need for higher accuracy to prevent overflow in operations in which the values of filter coefficients vary over a broad range, can decrease the amount of operations, and further, can reduce the scale of hardware.

In addition, the action of envelope target value generation circuit 305 keeps filter coefficients from becoming large values even when the input signal level is low, as in the thirteenth embodiment, and therefore eliminates the need for higher accuracy to prevent overflow in operations in which the values of filter coefficients vary over a broad range, can decrease the amount of operations, and further, can reduce the scale of hardware. The amount of operations required for the convolution operations of the input signal and filter coefficients can also be reduced because the filter coefficients are real signals and not complex amounts.

(Eighteenth Embodiment)

Figure 29:
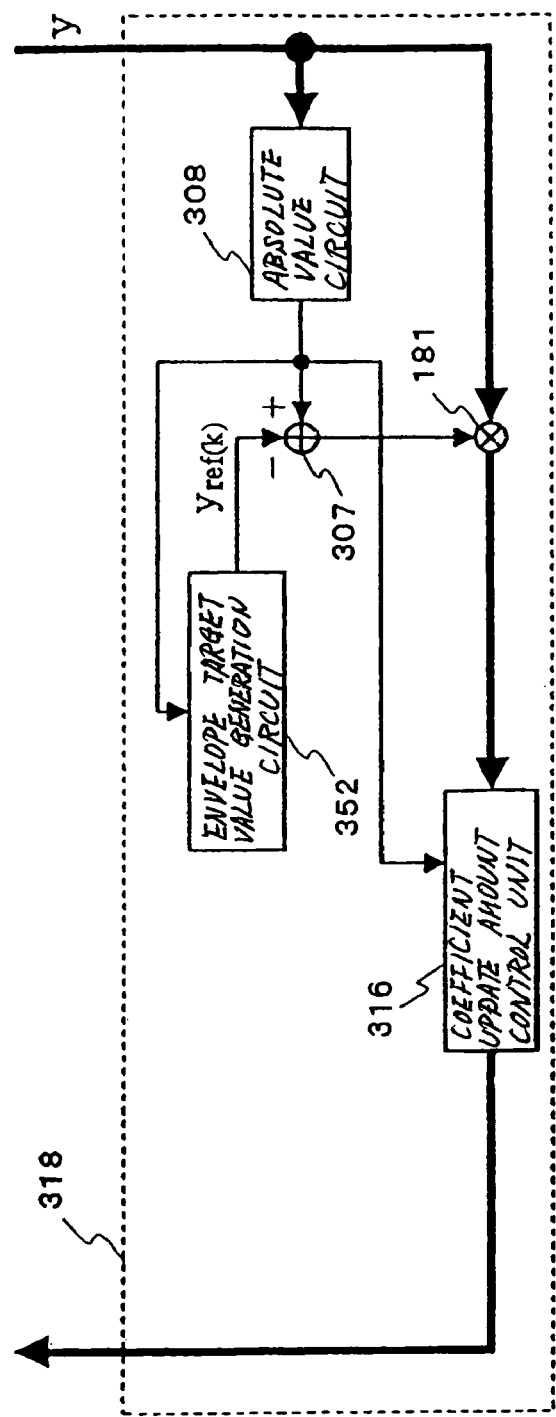
FIG. 29 is a block diagram showing the configuration of the principal elements of the eighteenth embodiment of the adaptive digital filter of the present invention.

As shown in FIG. 29, the adaptive digital filter of the eighteenth embodiment differs from the adaptive digital filter of the seventeenth embodiment in that the envelope target value is generated based on the output signal of the adaptive digital filter.

Envelope target value generation circuit 352 that is provided in the adaptive digital filter of the eighteenth embodiment generates an envelope target value based on the value of the envelope (i.e., the amplitude value) of the output signal of the adaptive digital filter that is found by absolute value circuit 308 and supplies the result to subtractor 307. Envelope target value generation circuit 352 is provided with, for example, the configuration shown in FIG. 8, generates a small envelope target value when the amplitude of the output signal is large, and generates a large envelope target value when the amplitude of the output signal is small.

The configuration is otherwise identical to that of the seventeenth embodiment. In addition, the operations of the adaptive digital filter of the eighteenth embodiment are identical to those of the adaptive digital filter of the seventeenth embodiment with the exception of the operation of envelope target value generation circuit 352.

Explanation next regards the effects of the present embodiment.

The envelope target value generated by envelope target value generation circuit 352 provided in the adaptive digital filter of the eighteenth embodiment decreases when the amplitude of the output signal of the adaptive digital filter is large. Increase in the output signal raises the possibility of increase in values such as the internal signals and filter coefficients in the filter unit. Decreasing the envelope target value changes the values of the internal signals and filter coefficients to the direction of decrease. In other words, the values of the internal signals and filter coefficients are kept within a fixed range. Keeping the values within a fixed range means that the probability of the occurrence of overflow in the internal signals and filter coefficients is reduced. Accordingly, the adaptive digital filter of the eighteenth embodiment, similar to the seventeenth embodiment, eliminates the need for higher accuracy to prevent overflow in operations in which the values of filter coefficients vary over a broad range, and thus can decrease the amount of operations, and further, reduce the scale of hardware.

In addition, as in the seventeenth embodiment, coefficient update amount control unit 316 causes the coefficient update amounts to become smaller when the amplitude of the input signal supplied by way of input terminal 301 is too large and thus reduces the probability that filter coefficients will overflow. The amount of operations required for the convolution operations of the input signal and filter coefficients is also reduced because the filter coefficients are real signals and not complex amounts.

(Nineteenth Embodiment)

Figure 30:
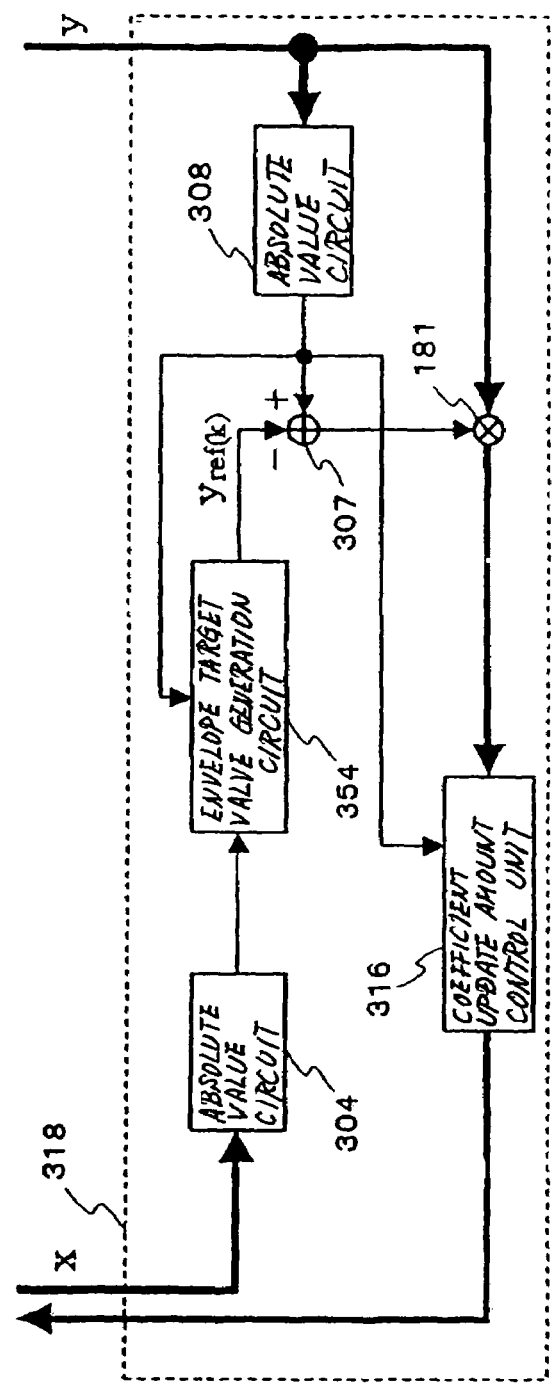
FIG. 30 is a block diagram showing the configuration of the principal elements of the nineteenth embodiment of the adaptive digital filter of the present invention.

As shown in FIG. 30, the adaptive digital filter of the nineteenth embodiment differs from the adaptive digital filter of the seventeenth embodiment in that the envelope target value is generated based on both the input signal and output signal of the adaptive digital filter.

Envelope target value generation circuit 354 provided in the adaptive digital filter of the nineteenth embodiment generates the envelope target value based on the value of the envelope (amplitude value) of the input signal of the adaptive digital filter that is found by absolute value circuit 304 and the value of the envelope (amplitude value) of the output signal of the adaptive digital filter that is found by absolute value circuit 308 and supplies the result to subtractor 307. Envelope target value generation circuit 354 is provided with, for example, the configuration shown in FIG. 10, generates a small envelope target value when the amplitude of the input signal is small, and generates a large envelope target value when the amplitude of the input signal is large. Envelope target value generation circuit 354 further generates a small envelope target value when the amplitude of the output signal is large and generates a large envelope target value when the amplitude of the output signal is small.

The configuration is otherwise identical to that of the seventeenth embodiment. In addition, the operations of the adaptive digital filter of the nineteenth embodiment are identical to those of the adaptive digital filter of the seventeenth embodiment with the exception of the operation of envelope target value generation circuit 354.

Explanation next regards the effects of the present embodiment.

Envelope target value generation circuit 354 of the adaptive digital filter of the nineteenth embodiment generates an envelope target value that combines both the properties of the envelope target value generated by envelope target value generation circuit 305 of the seventeenth embodiment and the properties of the envelope target value generated by envelope target value generation circuit 352 of the eighteenth embodiment. The probability that filter coefficients will cause overflow is therefore reduced. Accordingly, the adaptive digital filter of the nineteenth embodiment, similar to the seventeenth embodiment, eliminates the need for higher accuracy to prevent overflow in operations in which the values of filter coefficients vary over a broad range, and thus enables a decrease of the amount of operations, and further, enables a reduction of the scale of hardware.

In addition, as in the seventeenth embodiment, coefficient update amount control unit 316 causes the coefficient update amount to decrease when the amplitude of the input signal supplied by way of input terminal 301 is too large and thus decreases the probability that filter coefficients will overflow. The amount of operations required for the convolution operations of the input signal and filter coefficients is also reduced because the filter coefficients are real signals and not complex amounts.

(Twentieth Embodiment)

Figure 31:
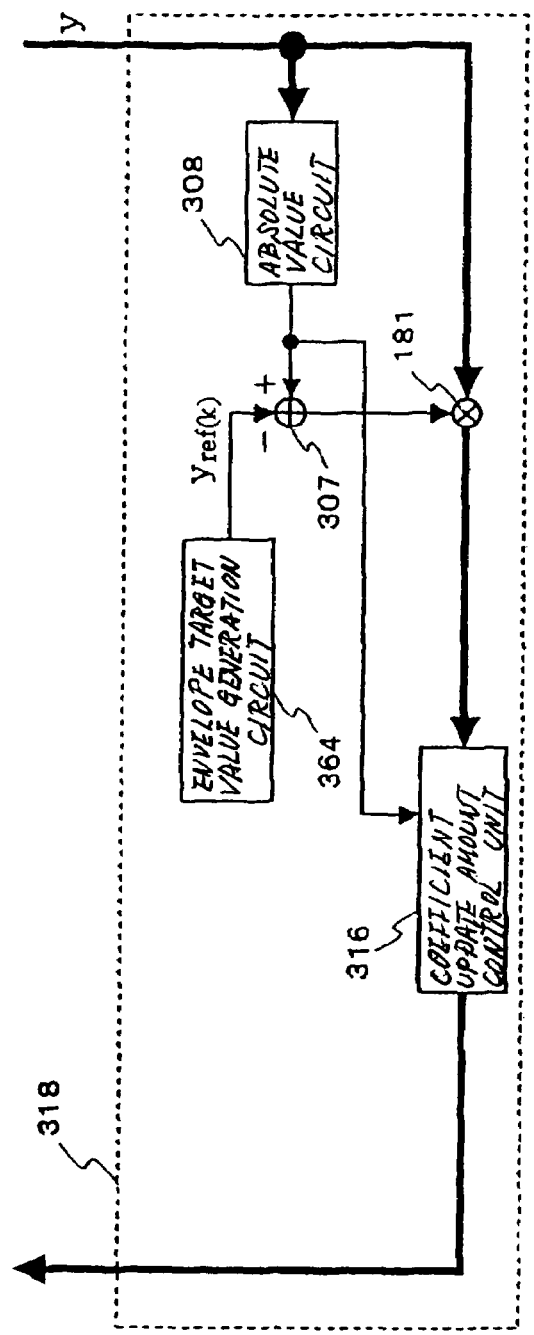
FIG. 31 is a block diagram showing the configuration of the principal elements of the twentieth embodiment of the adaptive digital filter of the present invention.

As shown in FIG. 31, the adaptive digital filter of the twentieth embodiment differs from the adaptive digital filter of the seventeenth embodiment in that a fixed envelope target value is generated. In other words, envelope target value generation circuit 364 provided in the adaptive digital filter of the twentieth embodiment generates a fixed envelope target value regardless of the input/output signals of the adaptive digital filter. The configuration is otherwise identical to that of the seventeenth embodiment. In addition, the operations of the adaptive digital filter of the twentieth embodiment are also identical to those of the adaptive digital filter of the seventeenth embodiment with the exception of the operation of envelope target value generation circuit 364.

As with the seventeenth embodiment, the adaptive digital filter of the twentieth embodiment causes the coefficient update amount to decrease by means of coefficient update amount control unit 316 when the amplitude of the input signal supplied to input terminal 301 is too large and thus reduces the probability that filter coefficients will overflow. In addition, the amount of operations required for the convolution operations of the input signal and filter coefficients is also reduced because the filter coefficients are real signals and not complex amounts.

(Twenty-first Embodiment)

Figure 32:
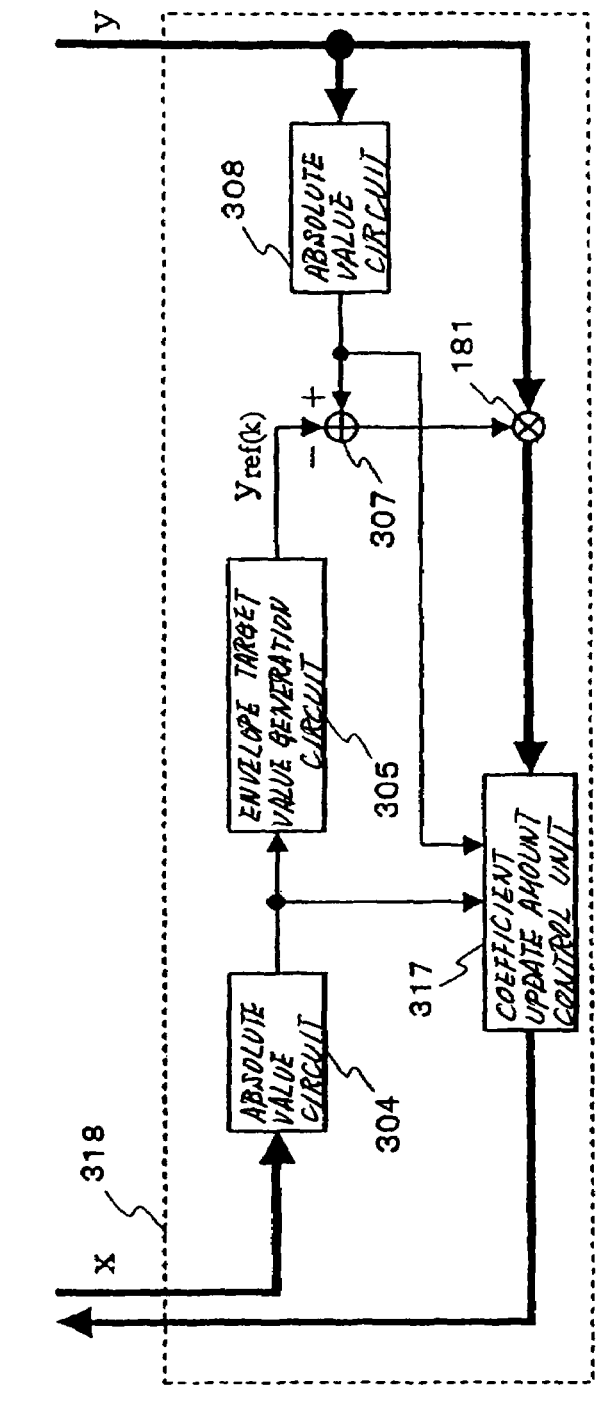
FIG. 32 is a block diagram showing the configuration of the principal elements of the twenty-first embodiment of the adaptive digital filter of the present invention.

As shown in FIG. 32, the adaptive digital filter of the twenty-first embodiment differs from the adaptive digital filter of the thirteenth embodiment in that the update amounts of filter coefficients are controlled based on both the input signal and output signal of the adaptive digital filter.

Coefficient update amount control unit 317 that is provided in the adaptive digital filter of the twenty-first embodiment is provided with the configuration shown in FIG. 18, FIG. 19, or FIG. 20, and has the function of reducing the coefficient update amount when the amplitude of the input signal of the adaptive digital filter is too large or when the amplitude of the output signal of the adaptive digital filter is too large. In other words, the coefficient update amount is, in a broad sense, subjected to monotonic decrease with respect to the estimated value of the amplitude of at least one of the input signal and output signal of the adaptive digital filter.

The configuration is otherwise identical to that of the thirteenth embodiment. In addition, the operations of the adaptive digital filter of the twenty-first embodiment are identical to those of the adaptive digital filter of the thirteenth embodiment with the exception of the operation of coefficient update amount control unit 317.

Explanation next regards the effects of the present embodiment.

The signal supplied to separate units $319_0$-$319_{N-1}$ from output terminal 503 in coefficient update amount control unit 317 having the configuration shown in FIG. 18, FIG. 19, or FIG. 20 decreases when the estimated value of the amplitude of the input signal that is supplied by way of input terminal 501 is too large, or when the estimated value of the amplitude of the output signal supplied by way of input terminal 502 is too large. Typically, when the output signal of the adaptive digital filter is large, the input signal of the adaptive digital filter is usually also large. Thus, as with the thirteenth embodiment, the filter coefficients do not become large values even when the input signal is extremely large, and the adaptive digital filter of the twenty-first embodiment therefore eliminates the need for higher accuracy to prevent overflow in operations in which the values of filter coefficients vary over a broad range, and thus enables a decrease in the amount of operations, and further, enables a reduction of the scale of the hardware.

In addition, as in the thirteenth embodiment, the action of envelope target value generation circuit 305 prevents the values of the filter coefficients from becoming large even when the input signal level is low, and as a result, there is no need for higher accuracy to prevent overflow in operations in which the values of filter coefficients vary over a broad range, the amount of operations can be decreased, and the scale of the hardware can be reduced. Still further, the amount of operations required for the convolution operations of the input signal and filter coefficients can be reduced because the filter coefficients are real signals and not complex amounts.

(Twenty-second Embodiment)

Figure 33:
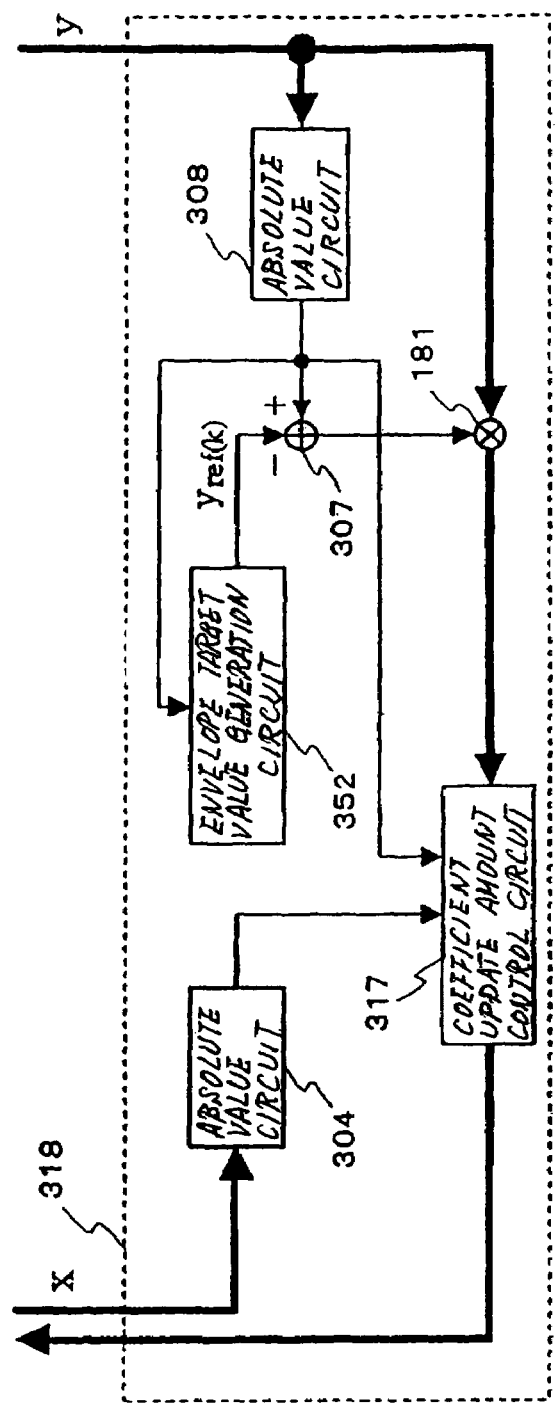
FIG. 33 is a block diagram showing the configuration of the principal elements of the twenty-second embodiment of the adaptive digital filter of the present invention.

As shown in FIG. 33, the adaptive digital filter of the twenty-second embodiment differs from the adaptive digital filter of the twenty-first embodiment in that the envelope target value is generated based on the output signal of the adaptive digital filter.

Envelope target value generation circuit 352 that is provided in the adaptive digital filter of the twenty-second embodiment generates an envelope target value based on the value of the envelope (i.e., the amplitude value) of the output signal of the adaptive digital filter that is found in absolute value circuit 308 and supplies the result to subtractor 307. Envelope target value generation circuit 352 is provided with, for example, the configuration shown in FIG. 8, generates a small envelope target value when the amplitude of the output signal is large, and generates a large envelope target value when the amplitude of the output signal is small.

The configuration is otherwise identical to that of the twenty-first embodiment. The operations of the adaptive digital filter of the twenty-second embodiment are identical to those of the adaptive digital filter of the twenty-first embodiment with the exception of the operation of envelope target value generation circuit 352.

Explanation next regards the effects of the present embodiment.

The envelope target value generated by envelope target value generation circuit 352 that is provided in the adaptive digital filter of the twenty-second embodiment decreases when the amplitude of the output signal supplied from the output terminal of the adaptive digital filter is large. Increase of the output signal raises the possibility that the values of the internal signal and filter coefficients in the filter unit are large. Reducing the envelope target value changes the values of the internal signals and filter coefficients to the direction of decrease. In other words, the values of the internal signals and filter coefficients are kept within a fixed range. Keeping these values within a fixed range means that the probability of the occurrence of overflow in the internal signals and filter coefficients is low. Accordingly, as with the embodiment of the twenty-first embodiment, the adaptive digital filter of the twenty-second embodiment eliminates the need for higher accuracy to prevent overflow in operations in which the values of filter coefficients vary over a broad range, enables a decrease of the amount of operations, and further, enables a reduction of the scale of hardware.

In addition, as with the twenty-first embodiment, coefficient update amount control unit 317 causes a decrease of the coefficient update amount when the amplitude of the input signal supplied by way of input terminal 301 is too large and thus reduces the probability that filter coefficients will overflow. Still further, the amount of operations required for the convolution operations of the input signal and filter coefficients is reduced because the filter coefficients are real signals and not complex amounts.

(Twenty-third Embodiment)

Figure 34:
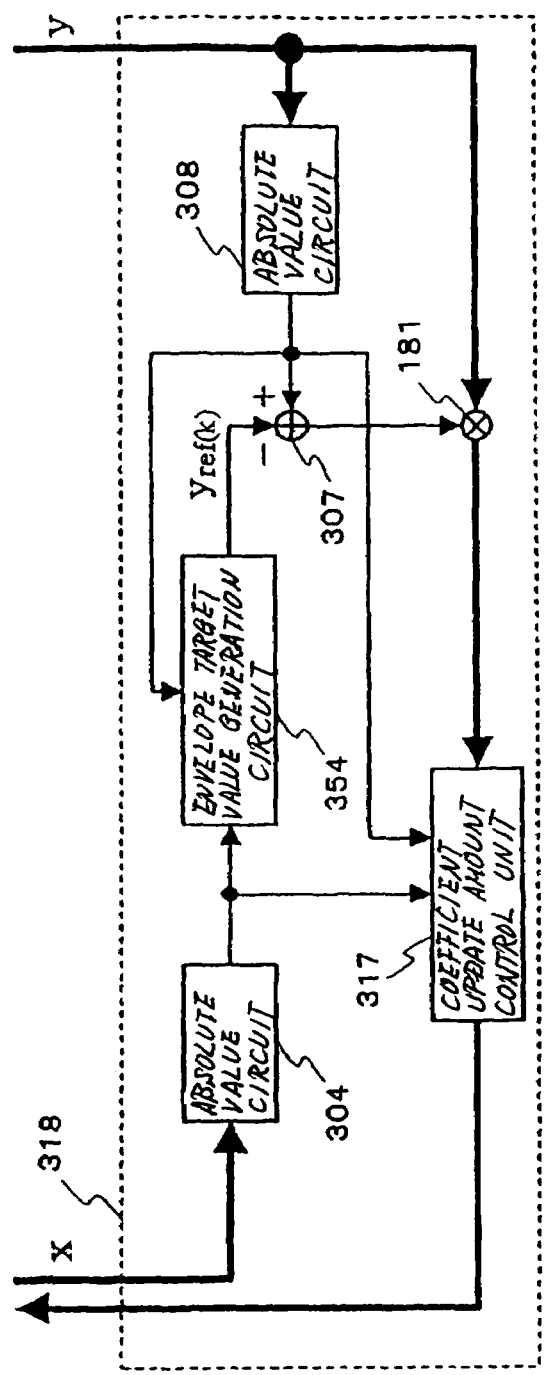
FIG. 34 is a block diagram showing the configuration of the principal elements of the twenty-third embodiment of the adaptive digital filter of the present invention.

As shown in FIG. 34, the adaptive digital filter of the twenty-third embodiment differs from the adaptive digital filter of the twenty-first embodiment in that the envelope target value is generated based on both the input signal and output signal of the adaptive digital filter.

Envelope target value generation circuit 354 provided in the adaptive digital filter of the twenty-third embodiment generates an envelope target value based on the value of the envelope (amplitude value) of the input signal of the adaptive digital filter that is found in absolute value circuit 304 and on the value of the envelope (amplitude value) of the output signal of the adaptive digital filter that is found in absolute value circuit 308 and supplies the result to subtractor 307. Envelope target value generation circuit 354 is provided with, for example, the configuration shown in FIG. 10, generates a small envelope target value when the amplitude of the input signal is small, and generates a large envelope target value when the amplitude of the input signal is large. In addition, envelope target value generation circuit 354 generates a small envelope target value when the amplitude of the output signal is large and generates a large envelope target value when the amplitude of the output signal is small.

The configuration is otherwise identical to that of the twenty-first embodiment. In addition, the operations of the adaptive digital filter of the twenty-third embodiment are identical to those of the adaptive digital filter of the twenty-first embodiment with the exception of the operation of envelope target value generation circuit 354.

Explanation next regards the operation of the present embodiment.

Envelope target value generation circuit 354 provided in the adaptive digital filter of the twenty-third embodiment generates an envelope target value that combines both the properties of the envelope target value generated by envelope target value generation circuit 305 of the twenty-first embodiment and the properties of the envelope target value generated by envelope target value generation circuit 352 of the twenty-second embodiment. As a result, the probability that filter coefficients will overflow is decreased. Accordingly, as with the twenty-first embodiment, the adaptive digital filter of the present embodiment eliminates the need for higher accuracy to prevent overflow in operations in which the values of filter coefficients vary over a broad range, and thus enables a decrease of the amount of operations, and further, enables a reduction of the scale of hardware.

As with the twenty-first embodiment, coefficient update amount control unit 317 causes decrease of the coefficient update amount when the amplitude of the input signal supplied by way of input terminal 301 is too large and thus reduces the probability that filter coefficients will overflow. The amount of operations required for the convolution operations of the input signal and filter coefficients is further reduced because the filter coefficients are real signals and not complex amounts.

(Twenty-fourth Embodiment)

Figure 35:
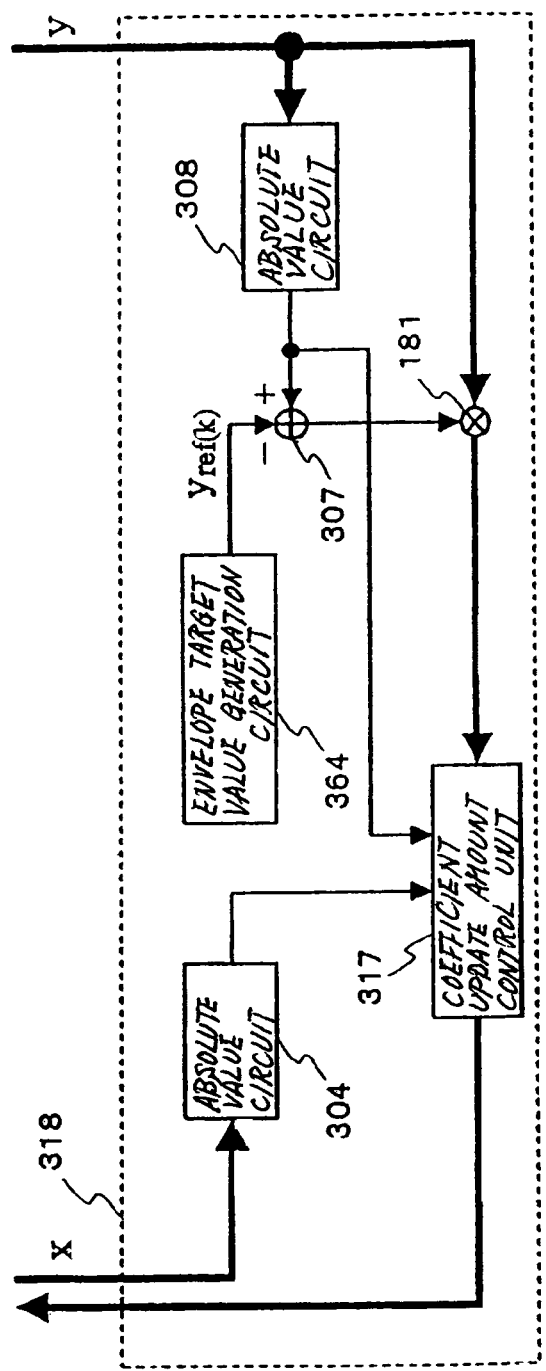
FIG. 35 is a block diagram showing the configuration of the principal elements of the twenty-fourth embodiment of the adaptive digital filter of the present invention.

As shown in FIG. 35, the adaptive digital filter of the twenty-fourth embodiment differs from the adaptive digital filter of the twenty-first embodiment in that a fixed envelope target value is generated. In other words, envelope target value generation circuit 364 that is provided in the adaptive digital filter of the twenty-fourth embodiment generates a fixed envelope target value regardless of the input/output signals of the adaptive digital filter. The configuration is otherwise identical to that of the twenty-first embodiment. In addition, the operations of the adaptive digital filter of the twenty-fourth embodiment are identical to those of the adaptive digital filter of the twenty-first embodiment with the exception of the operation of envelope target value generation circuit 364.

As with the twenty-first embodiment, according to the adaptive digital filter of the twenty-fourth embodiment, coefficient update amount control unit 317 causes the coefficient update amount to decrease when the amplitude of the input signal supplied by way of input terminal 301 is too large, whereby the probability that filter coefficients will overflow is decreased. In addition, the amount of operations required for the convolution operations of the input signal and filter coefficients is reduced because the filter coefficients are real signals and not complex amounts.

(Working Examples)

Explanation next regards working examples of averaging circuits 404 and 405 that are provided in the above-described envelope target value generation circuits 305, 352, and 354.

Figure 36:
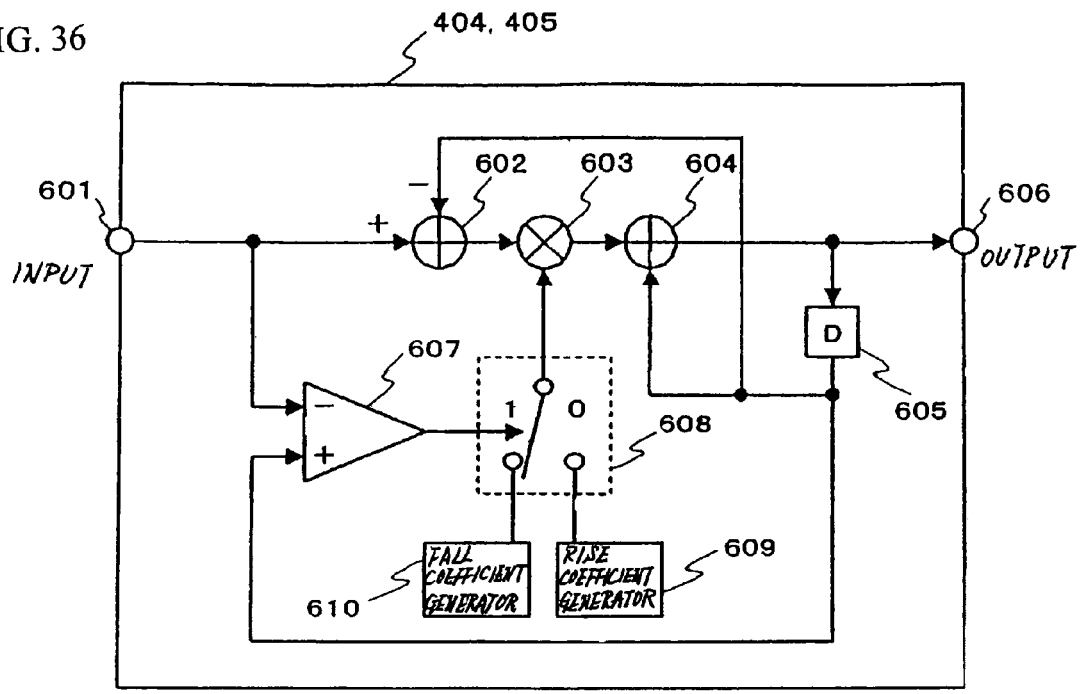
FIG. 36 is a block diagram showing the configuration of a working example of the averaging circuit used in the envelope target value generation circuit.

FIG. 36 is a block diagram showing the configuration of the working example of the averaging circuit used in an envelope target value generation circuit.

The signal applied to input terminal 601 of the averaging circuit shown in FIG. 36 is supplied to subtractor 602 and comparator 607. Comparator 607 compares the signal supplied by way of input terminal 601 with the signal supplied from delay unit 605 and supplies the comparison result "0" to switch 608 when the signal supplied by way of input terminal 601 is larger than the signal supplied from delay unit 605, and supplies the comparison result "1" to switch 608 when the signal supplied by way of input terminal 601 is smaller than the signal supplied from delay unit 605. When the signal supplied by way of input terminal 601 and the signal supplied from delay unit 605 are the same size, the output value may be any value.

When the comparison result supplied from comparator 607 is "1," switch 608 supplies multiplier 603 with a fall coefficient supplied from fall coefficient generator 610, and when the comparison result is "0," supplies multiplier 603 with a rise coefficient supplied from rise coefficient generator 609. Subtractor 602 subtracts the output signal of delay unit 605 from the input signal supplied by way of input terminal 601 and supplies this result to multiplier 603. Multiplier 603 multiplies the signal supplied from subtractor 602 by the rise coefficient or the fall coefficient supplied from switch 608 and supplies the result to adder 604. Adder 604 adds the signal supplied from delay unit 605 to the signal supplied from multiplier 603 and supplies this result to delay unit 605 and output terminal 606. Delay unit 605 delays the signal supplied from adder 604 by one sampling cycle and supplies the result to comparator 607, adder 604, and subtractor 602. The signal supplied from adder 604 is supplied from output terminal 606 as the averaged signal of the signal received from input terminal 601.

The feature of the averaging circuit shown in FIG. 36 is the switching of the coefficient supplied to multiplier 603 by the comparison result of comparator 607. The rise coefficient and the fall coefficient are values between "0" and "1". When the input signal supplied by way of input terminal 601 is increasing, the rise coefficient determines the speed at which the averaged output signal supplied from output terminal 606 becomes large. When the input signal supplied by way of input terminal 601 is decreasing, the fall coefficient determines the speed at which the averaged output signal supplied from output terminal 606 becomes small. In other words, the rise coefficient and fall coefficient determine the time constant of averaging. As a result, if the fall coefficient is larger than the rise coefficient, the signal supplied from output terminal 606 is more prone to increase than to decrease when the value of the input signal supplied by way of input terminal 601 rises or falls. On the other hand, if the fall coefficient is smaller than the rise coefficient, the signal supplied from output terminal 606 is more prone to decrease than to increase.

In averaging circuit 404 that averages the amplitude value of the input signal, the fall coefficient is set large and the rise coefficient is set small. According to these settings, the time constant of averaging becomes shorter when the input signal is smaller than the output signal, and the time constant of averaging becomes longer when the input signal is larger than the output signal. In this way, the output signal of averaging circuit 404 is more prone to decreasing than to increasing. As a result, the envelope target value tends to decrease and tends not to increase. A smaller envelope target value further reduces the probability of the occurrence of overflow of filter coefficients.

On the other hand, the fall coefficient is set small and the rise coefficient is set large in averaging circuit 405 that averages the amplitude value of the output signal. These settings result in a longer averaging time constant when the input signal is smaller than the output signal and a shorter averaging time constant when the input signal is larger than the output signal. As a result, the output signal of averaging circuit 405 tends to increase and tends not to decrease. The output of averaging circuit 405 is converted to a reciprocal by reciprocal circuit 406, and the envelope target value therefore tends to decrease and tends not to increase.

The same effect is obtained when an averaging circuit having the same functions is used in a configuration other than the configuration shown in FIG. 36.

Explanation next regards a working example in which the adaptive digital filter of the present invention is applied in the multipath canceller of an FM receiver.

Figure 37:
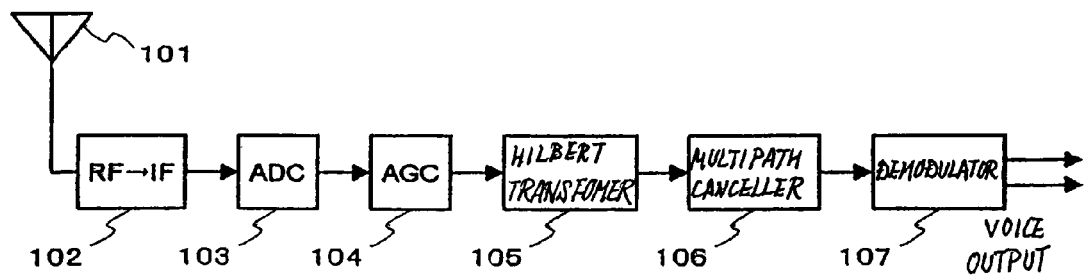
FIG. 37 is a block diagram showing an example of the configuration of the FM receiver of the present invention.

As shown in FIG. 37, the FM receiver of the present working example is provided with: antenna 101, radio frequency/intermediate frequency converter 102, analog/digital converter 103, automatic gain controller 104, Hilbert transformer 105, multipath canceller 106, and demodulator 107; the adaptive digital filter according to any one of the above-described first to twenty-fourth embodiments being used as multipath canceller 106.

An FM modulated wave received at antenna 101 is converted in radio frequency/intermediate frequency converter 102 to a signal of an intermediate frequency band and supplied to analog/digital converter 103.

Analog/digital converter 103 samples the analog signal supplied from radio frequency/intermediate frequency converter 102 at an appropriate sampling frequency to convert to a digital signal and supplies the result to automatic gain controller 104.

Automatic gain controller 104 amplifies at a gain in which the amplitude of the output signal is kept within a fixed range within a range in which a CMA algorithm that takes the envelope value as index is not adversely affected and supplies the result to Hilbert transformer 105.

In this case, increasing the gain of automatic gain controller 104 to accelerate the follow-up speed suppresses the change of the envelope required for the CMA algorithm, and the gain of automatic gain controller 104 is therefore made low to delay the follow-up speed. Adopting this approach in a conventional FM receiver would cause increase in the amplitude of the input signal and increase in the update amount of filter coefficients, giving rise to overflow of the filter coefficients, but in the present invention, no problem occurs because the update amount of filter coefficients is controlled.

Hilbert transformer 105 converts the signal supplied from automatic gain controller 104 to an analytic signal, i.e., a complex signal in which one of two signals that have phases that differ from each other by 90° is a real part and the other signal is an imaginary part, and supplies the result to multipath canceller 106.

Multipath canceller 106 converts the complex signal supplied from Hilbert transformer 105 to a signal in which the influence of multiple reflection has been reduced and supplies this signal to demodulator 107. Demodulator 107 subjects the signal that is supplied from multipath canceller 106 to FM demodulation and supplies a signal of the speech frequency band. Although a complex signal is supplied as output from output terminal 302 of the adaptive digital filter of each of the above-described embodiments, only the real part of this signal may be extracted and supplied to demodulator 107, or only the imaginary part of this signal may be extracted, code-inverted, and then supplied to demodulator 107.

The present invention is not limited to the configurations shown in the first to twenty-fourth embodiments and is open to various modifications as described hereinbelow.

In the first to twenty-fourth embodiments, coefficient update amount control units 306, 316, and 317 were inserted on the path from multiplier 310 or multiplier 181 to separate units $319_0$-$319_{N-1}$, but these coefficient update amount control units can also be inserted at other points on the path from subtractor 307 that finds the error between an envelope target value and an envelope derived from the output signal to separate units $319_0$-$319_{N-1}$. For example, in the configuration shown in FIG. 3, the coefficient update amount control units can be inserted in the path from subtractor 307 to multiplier 310, or can be inserted in the path from output terminal 302 of the adaptive digital filter to multiplier 310.

Although real-part extraction circuits $335_0$-$335_{N-1}$ and real-part extraction circuit 309 were used in the first to twelfth embodiments, all or a portion of these components may be replaced by imaginary-part extraction/inversion circuits. An imaginary-part extraction/inversion circuit is a circuit that extracts only the imaginary part of a received complex signal and supplies a value in which the code has been inverted.

The complex input signal that is received from input terminal 301 of the adaptive digital filter was taken as a complex signal in which one of two signals that are generated from one real signal and that have phases that differ from each other by 90° is a real part and the other signal is an imaginary part, and the same effect as in the first to twelfth embodiments can therefore be obtained even when an imaginary-part extraction/inversion circuit is used.

In the first to twelfth embodiments, all of the filter coefficients were taken as real numbers, i.e., scalar values, but it is also possible for a portion of the filter coefficients to be complex numbers, although this change somewhat reduces the effect of decreasing the amount of operations. In addition, real-part extraction circuit 309 may be shifted to the output side of multiplier 310 or shifted to the output side of multiplier 311 and operations carried out by complex numbers in multipliers 310 and 311.

Although an FIR filter was used as the filter unit in each of the above-described embodiments, an IIR filter can also be used.

In each of the first to twenty-fourth embodiments, cases were described in which an LMS algorithm was used as the adaptive algorithm, but algorithms such as a Recursive Least Squares Algorithm, a Least Squares Algorithm, an Affine Projection Algorithm, and a Gradient Algorithm can also be used as the adaptive algorithm. When the number of multiplications in filter coefficient updating by means of these adaptive algorithms is greater than for the LMS algorithm, the effect of reducing the amount of operations that is realized by converting filter coefficients to real numbers is further augmented.

In addition, although an adaptive digital filter applied to FM modulation was assumed in the first to twenty-fourth embodiments, the present invention can also be applied to other constant-amplitude modulation such as PSK (Phase Shift Keying). Alternatively, the present invention can also be applied to modulation modes such as QAM (Quadrature Amplitude Modulation) if multilevel CMA is employed. The present invention can further be applied to those constant modulus algorithms disclosed in the above-described Non-Patent Document 1 in which the output signal is a complex signal.

Although explanation in the above-described first to twenty-fourth embodiments focused on CMA that takes an envelope as index, the present invention can also be applied to cases in which other statistics described in Non-Patent Document 1 are taken as index.

The functions of the adaptive digital filter of the present invention may also be realized by hardware through the use of separate components, ASIC (Application-specific Integrated Circuits), or FPGA (Field-Programmable Gate Arrays), or may be realized by a computer equipped with a CPU or DSP (Digital Signal Processor) for carrying out processing in accordance with a program. The program may be provided recorded on a recording medium such as a magnetic disk or semiconductor memory that can be read by a computer, or may be provided by a communication device by way of a network. In such a case, the computer reads the program when power is introduced and then operates as the adaptive digital filter described in the above-described first to twenty-fourth embodiment by executing processes in accordance with the program.

The invention claimed is:

1. An adaptive digital filter, realized by hardware or a non-transitory computer readable medium storing a program executed by a computer, comprising:
    a filter unit for generating an output signal by a convolution operation of an input signal and a filter coefficient and supplying the result as output; and
    a coefficient control unit for controlling said filter coefficients based on error between a target signal and an index value derived from said output signal and controlling the update amount of said filter coefficients based on the estimated value of the amplitude of at least one of said input signal and said output signal;
    wherein, when said coefficient control unit controls said target signal based on the amplitude of said output signal, said coefficient control unit makes said target signal smaller when the amplitude of said output signal is increasing, makes said target signal larger when the amplitude of said output signal is decreasing, and moreover, makes the speed of making said target signal smaller faster than the speed of making said target signal larger.

2. An FM receiver comprising:
    an adaptive digital filter, realized by hardware or a non-transitory computer readable medium storing a program executed by a computer, comprising:
    a filter unit for generating an output signal by a convolution operation of an input signal and a filter coefficient and supplying the result as output; and
    a coefficient control unit for controlling said filter coefficients based on error between a target signal and an index value derived from said output signal and controlling the update amount of said filter coefficients based on the estimated value of the amplitude of at least one of said input signal and said output signal;
    wherein, when said coefficient control unit controls said target signal based on the amplitude of said output signal, said coefficient control unit makes said target signal smaller when the amplitude of said output signal is increasing, makes said target signal larger when the amplitude of said output signal is decreasing, and moreover, makes the speed of making said target signal smaller faster than the speed of making said target signal larger; and a Hilbert converter for applying as input to said adaptive digital filter a complex signal generated by subjecting an FM (Frequency Modulation) modulated signal that has been converted to an intermediate frequency and digitized to a Hilbert transform.

3. A signal processing method comprising:

generating an output signal by means of a convolution operation of an input signal and a filter coefficient and supplying the result as output; and controlling said filter coefficient based on error between a target signal and an index value derived from said output signal, and controlling the update amount of said filter coefficient based on the estimated value of the amplitude of at least one of said input signal and said output signal;

wherein, when said target signal is controlled based on the amplitude of said output signal, said target signal is made smaller when the amplitude of said output signal is increasing, said target signal is made larger when the amplitude of said output signal is decreasing, and moreover, the speed of making said target signal smaller is made faster than the speed of making said target signal larger.

4. A non-transitory computer readable medium storing a program for causing a computer to operate as:

a filter unit for generating and supplying an output signal by means of a convolution operation of an input signal and a filter coefficient; and a coefficient control unit for controlling said filter coefficient based on error between a target signal and an index value derived from said output signal, and controlling an update amount of said filter coefficient based on the estimated value of the amplitude of at least one of said input signal and said output signal;

wherein said coefficient control unit, when controlling said target signal based on the amplitude of said output signal, makes said target signal smaller when the amplitude of said output signal is increasing, makes said target signal larger when the amplitude of said output signal is decreasing, and moreover, the speed of making said target signal smaller is made faster than the speed of making said target signal larger.

* * * * *